(12) United States Patent
Joo et al.

(10) Patent No.: US 8,541,480 B2
(45) Date of Patent: Sep. 24, 2013

(54) APPARATUS AND METHOD FOR MODIFYING PHYSICAL PROPERTIES OF NANOSTRUCTURE USING FOCUSED ELECTRON BEAM, AND NANO-BARCODE AND SERIAL-JUNCTION NANOWIRE FABRICATED THEREBY

(75) Inventors: Jinsoo Joo, Seoul (KR); Young Ki Hong, Seoul (KR); Dong Hyuk Park, Seoul (KR); Seong Gi Jo, Incheon (KR); Min Ho Koo, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 100 days.

(21) Appl. No.: 13/104,444

(22) Filed: May 10, 2011

(65) Prior Publication Data
US 2011/0282021 A1 Nov. 17, 2011

Related U.S. Application Data

(60) Provisional application No. 61/429,413, filed on Jan. 3, 2011, provisional application No. 61/429,419, filed on Jan. 3, 2011.

(30) Foreign Application Priority Data

| May 11, 2010 | (KR) | .................. 10-2010-0043910 |
| Apr. 22, 2011 | (KR) | .................. 10-2011-0037757 |
| Apr. 25, 2011 | (KR) | .................. 10-2011-0038421 |

(51) Int. Cl.
*H05B 6/68* (2006.01)
*C08G 61/04* (2006.01)

(52) U.S. Cl.
USPC .................................... 522/1; 520/1

(58) Field of Classification Search
USPC .................................... 522/1; 520/1
See application file for complete search history.

(56) References Cited

U.S. PATENT DOCUMENTS

2008/0061249 A1* 3/2008 Brown et al. ............ 250/492.2
2011/0171137 A1* 7/2011 Patolsky et al. ............. 424/9.3

* cited by examiner

*Primary Examiner* — Ling Choi
*Assistant Examiner* — Jessica E Whiteley
(74) *Attorney, Agent, or Firm* — Swanson & Bratschun, L.L.C.

(57) ABSTRACT

According to one embodiment of the present invention, a portion of a light-emitting polymer material or a conductive polymer material can be irradiated with a focused electron beam, so that the physical properties of that portion can be modified. For this purpose, one embodiment of the present invention comprises an apparatus for modifying the physical properties of a nanostructure using a focused electron beam, the apparatus comprising: a nanostructure; a focused electron beam-irradiating unit that serves to irradiate a nanoscale electron beam such that it is focused on the nanostructure; and a focused electron beam-controlling unit that serves to control the irradiation position of the nanoscale electron beam so as to modify the physical property of a portion of the nanostructure.

9 Claims, 28 Drawing Sheets

(17 of 28 Drawing Sheet(s) Filed in Color)

Fig.2
(a) 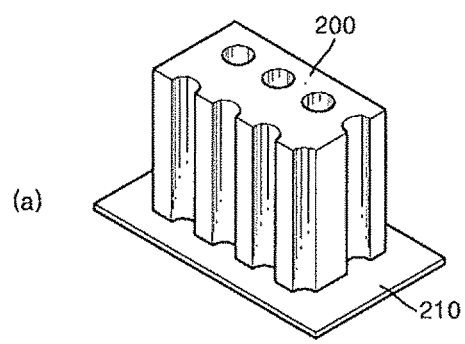
(b) 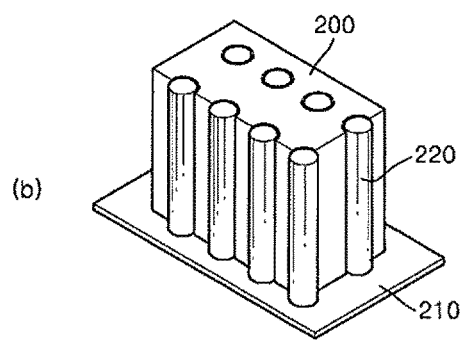
(c) 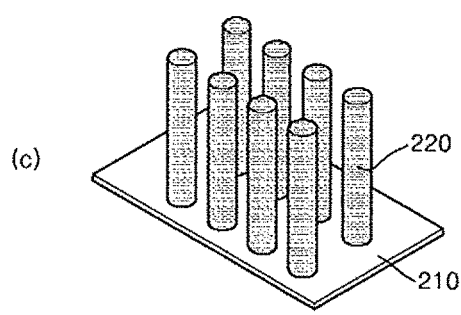

Fig.8
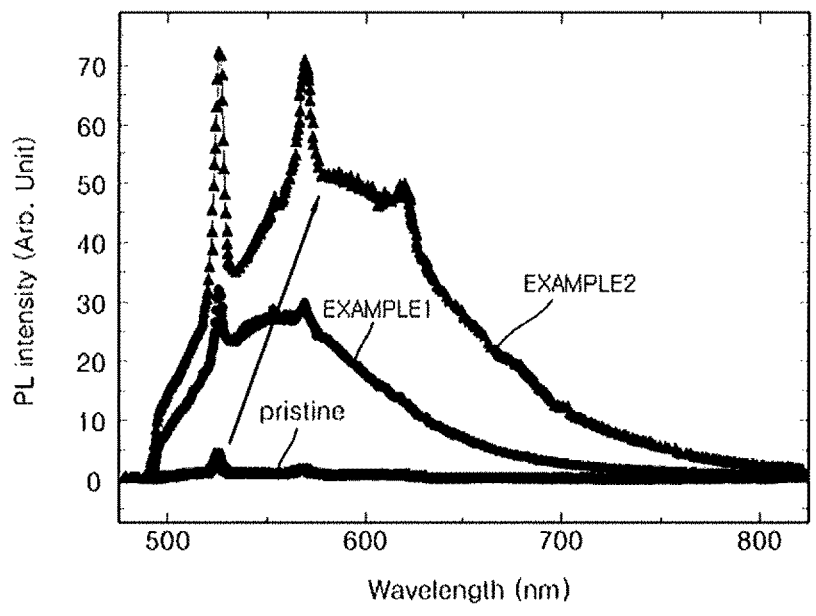
(a)
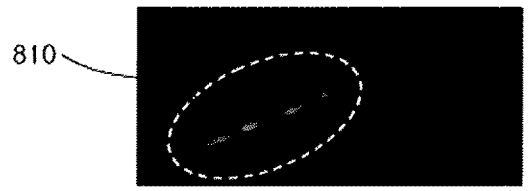
(b)
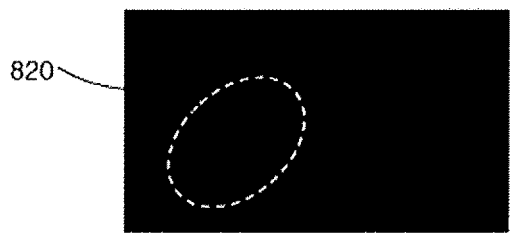
(c)

(a)            (b)

(c)            (d)

(e)            (f)

pattern1
pattern2
pattern3
pattern4
pattern5
pattern6

APPARATUS AND METHOD FOR MODIFYING PHYSICAL PROPERTIES OF NANOSTRUCTURE USING FOCUSED ELECTRON BEAM, AND NANO-BARCODE AND SERIAL-JUNCTION NANOWIRE FABRICATED THEREBY

BACKGROUND OF THE INVENTION

1. Field of the Invention

The present invention relates to a method for modifying the physical properties of a nanostructure, and more particularly to an apparatus and method for modifying the physical properties of a nanostructure using a focused electron beam, and a nano-barcode and serial-junction nanowire fabricated thereby.

2. Description of the Prior Art

Previous studies on the structural, electrical and optical properties of π-conjugated organic polymers indicate that these π-conjugated organic polymers have excellent electrical properties and photoreactivity. Due to these advantages, these organic polymers are being used in place of metals as active layer materials or electrode materials in organic photoelectric devices, such as organic light-emitting diodes (OLEDs), organic field-effect transistors (OFETs) and organic solar cells (OSCs).

With the recent development of nanotechnology, nanostructures, such as nanowires, nanotubes or nanoplates, fabricated from π-conjugated organic materials, have been actively used for the fabrication of organic photoelectric devices.

In order to more effectively apply π-conjugated organic materials to organic photoelectric devices, it is necessary to control the optical and electrical properties thereof. Particularly, when the optical and electrical properties of a portion of nano-structures such as nanowires made of π-conjugated light-emitting polymers are controlled at the nanometer scale, the fields of application of the nano-structures become more diverse.

Barcodes possess a close relation with human life and have been widely used for sales management and electronic ordering systems in distribution fields, including department stores, convenience stores and supermarkets. In factories, barcodes are used for production management, quality control, and the management of raw materials and products in warehouses, thus greatly contributing to an increase in productivity and a reduction in production costs. In the field of office automation, barcodes are used for time and attendance management, asset management, data management, etc., thus greatly contributing to industrial development. Barcodes have been recognized as means that make it possible to rapidly and accurately collect data in various application fields.

Nano-barcodes can be used in nanoelectronic devices, photonic structures, nanosurgery devices, magnetic devices and the like. In addition, nano-barcodes can be used in various fields, including cell separation and magnetic labeling in the biomedicine field. However, the nano-barcodes that are currently being developed are mostly alternate arrangements of nanorods that are made of different materials in order to take advantage of the change in reflectivity or absorptivity attributable to the arrangement of the different materials.

In recent years, studies on the fabrication of various organic or inorganic nanomaterials using electron beams or ion beams, or on the modification of the physical properties of previously fabricated nanomaterials have been actively reported. For example, control technology for cutting or bending a portion of carbon nanotubes or graphenes has been reported. However, in these technologies, a target material is commonly changed to another material due to the high energy of the electron beams or ion beams. Thus, there is a need for studies on a method that can be used specifically to modify only the physical properties of the target material on the nano scale, or to modify only a specific portion of the target material while the original state of the target material is maintained.

SUMMARY OF THE INVENTION

Accordingly, the present invention has been made in view of the problems occurring in the prior art, and it is an object of the present invention to provide an apparatus and method for modifying the physical properties of a portion of a light-emitting polymer nanostructure, a conductive polymer nanostructure or an inorganic nanostructure using a focused electron beam.

It is another object of the present invention to provide a nano-barcode, the photoluminescent properties of which can be controlled, and which can be easily fabricated, and a serial-junction nanowire, the electrical properties of which can be controlled.

To achieve the above objects, in accordance with one aspect of the present invention, there is provided an apparatus for modifying a physical property of a nanostructure using a focused electron beam, the apparatus comprising: the nanostructure; a focused electron beam-irradiating unit that serves to irradiate a nanoscale electron beam so as to focus it on the nanostructure; and a focused electron beam-controlling unit that serves to control the irradiation position of the nanoscale electron beam so as to modify a physical property of a portion of the nanostructure.

In the apparatus, the nanostructure may be a π-conjugated polymer nanostructure or an inorganic nanostructure. Also, the nanostructure may be formed of a light-emitting polymer material or a conductive polymer material.

Also, the π-conjugated polymer nanostructure may be formed of one or more polymers selected from the group consisting of polythiophene, poly(p-phenylenevinylene), polythiophenevinylene, poly(p-phenylene), poly(p-phenylacetylene), and derivatives thereof, and the conductive polymer nanostructure may be formed of polypyrrole.

Moreover, the inorganic nanostructure may be formed of titanium dioxide ($TiO_2$), zinc oxide (ZnO) or silicon dioxide ($SiO_2$).

The nanostructure may be a nanostructure comprising at least one selected from the group consisting of nanowires, nanorods, nanotubes and nanoplates.

The focused electron beam-irradiating unit may be any one of a scanning electron microscope, a transmission electron microscope and an E-beam lithography system.

In addition, the electron beam may have a diameter of 1 nm or more, and may be focused to a size of 1000 nm or less.

The physical property of the nanostructure that is modified may be at least one selected from among structural properties, photoluminescent properties, lattice defects, doped states and electrical properties.

The nanostructure may be a nanowire, and the focused electron beam-controlling unit may serve to control the irradiation position so that portions that are irradiated with the electron beam and portions that are not irradiated with the electron beam are formed alternately along the nanowire.

The nanostructure may be an inorganic nanolayer, and the focused electron beam-controlling unit may serve to control the irradiation position so that the inorganic nanolayer is irradiated with the electron beam to form a two-dimensional pattern.

In accordance with another aspect of the present invention, there is provided a method of modifying a physical property of a nanostructure using a focused electron beam, the method comprising the steps of (S10) providing a nanostructure on a substrate; (S20) irradiating the nanostructure with a nanoscale electron beam using a focused electron beam-irradiating unit so as to focus it on the nanostructure; and (S30) controlling the irradiation position of the nanoscale electron beam using a focused electron beam-controlling unit so as to modify a physical property of a portion of the nanostructure.

In step (S10) of providing the nanostructure, the nanostructure may be a π-conjugated polymer nanostructure or an inorganic nanostructure, in which the π-conjugated polymer nanostructure may be formed of a light-emitting polymer material or a conductive polymer material. Also, the inorganic nanostructure may be formed of titanium dioxide ($TiO_2$), zinc oxide (ZnO) or silicon dioxide ($SiO_2$).

Step (S30) of controlling the irradiation position of the nanoscale electron beam may be a step of controlling the irradiation position of the nanoscale electron beam using the focused electron beam-controlling unit so as to form a one-dimensional or two-dimensional pattern corresponding to a change in a physical property of a portion of the nanostructure.

In step (S30) of controlling the irradiation position of the nanoscale electron beam, the physical property of the nanostructure that is modified may be at least one selected from among structural properties, photoluminescent properties, lattice defects, doped states and electrical properties.

In step (S30) of controlling the irradiation position of the nanoscale electron beam, the nanostructure may be a nanowire, and the focused electron beam-controlling unit may serve to control the irradiation position so that portions that are irradiated with the electron beam and portions that are not irradiated with the electron beam are formed alternately along the nanowire.

In accordance with still another aspect of the present invention, there is provided a π-conjugated polymer nano-barcode fabricated so that the photoluminescent property thereof is modified by said method of modifying the physical property of the nanostructure using the focused electron beam.

In accordance with still another aspect of the present invention, there is provided a series-junction polymer nanowire fabricated by said method of modifying the physical property of the nanostructure using the focused electron beam.

In accordance with still another aspect of the present invention, there is provided an inorganic nano-barcode fabricated so that the photoluminescent property thereof is modified by said method of modifying the physical property of the nanostructure using the focused electron beam.

The nano-barcode can exhibit a Raman signal as a change in the structural property of the π-conjugated light-emitting polymer nanowire.

The nano-barcode can exhibit a change in the photoluminescent property of the π-conjugated polymer nanowire. Also, the nano-barcode can exhibit a change in the photoluminescent property of the π-conjugated light-emitting polymer nanowire on the basis of PL (photoluminescence) intensity. In addition, the nano-barcode may be a color nano-barcode that exhibits a change in the photoluminescent property of the π-conjugated light-emitting polymer nanowire from PL color.

The PL color of the portion irradiated with the focused electron beam can be red-shifted in comparison with the portion not irradiated with the focused electron beam.

As the dose of the focused electron beam increases, the PL color of the portion irradiated with the focused electron beam can be red-shifted and the PL intensity can increase.

The π-conjugated light-emitting polymer may be P3MT (poly(3-methylthiophene)). If the PL color of the portion that is not irradiated with the focused electron beam is green and the dose of the focused electron beam is set within the range from $5.0 \times 10^{16}$ electrons/cm$^2$ to $9.0 \times 10^{16}$ electrons/cm$^2$, the PL color of the portion irradiated with the focused electron beam may be yellow. If the PL color of the portion that is not irradiated with the focused electron beam is yellow and the dose of the focused electron beam is set within the range from $1.0 \times 10^{17}$ electrons/cm$^2$ to $5.0 \times 10^{17}$ electrons/cm$^2$, the PL color of the portion that is irradiated with the focused electron beam may be red.

The π-conjugated light-emitting polymer nanowire irradiated with the focused electron beam may be formed of a single material, portions of which have different physical properties.

BRIEF DESCRIPTION OF THE DRAWINGS

The file of this patent contains at least one drawing executed in color. Copies of this patent with color drawings will provided by the Office upon request and payment of the necessary fee.

FIGS. 2(a)-2(c) are sets of figures schematically showing a process of fabricating a π-conjugated light-emitting polymer nanowire that is used as a nanostructure according to one embodiment of the present invention.

FIGS. 3(a)-3(c) are sets of photographs showing the results of irradiation of a portion of the P3MT (poly(3-methylthiophene)) nanowire with a focused electron beam according to one embodiment of the present invention, in which FIG. 3a is a scanning electron microscope photograph showing the whole of the single strand of the P3MT nanowire, FIG. 3b is an enlarged photograph of the portion that is irradiated with the focused electron beam, and FIG. 3c is an enlarged photograph of the portion that is not irradiated with the focused electron beam.

FIGS. 4(a) and 4(b) are sets of figures showing the micro-Raman spectrum (λex=633 nm) of the single strand of the P3MT nanowire as a function of the dose of a focused electron beam, in which FIG. 4a shows a micro-Raman spectrum in the range from 1050 cm$^{-1}$ to 1650 cm$^{-1}$, and FIG. 4b shows a micro-Raman spectrum in the range from 600 cm$^{-1}$ to 1050 cm$^{-1}$.

FIGS. 5(a)-5(d) are sets of figures showing the micro-Raman spectrum of the single strand of the P3MT nanowire, decomposed into Lorentzian curves, in which FIG. 5a shows the micro-Raman spectrum of the P3MT nanowire (not irradiated with a focused electron beam), decomposed into Lorentzian curves, FIG. 5b shows the micro-Raman spectrum of the P3MT nanowire (irradiated with a focused electron beam at a dose of $7.5 \times 10^{16}$ electrons/cm$^2$), decomposed into Lorentzian curves, FIG. 5c shows the micro-Raman spectrum of the P3MT nanowire (irradiated with a focused electron beam at a dose of $2.5 \times 10^{17}$ electrons/cm$^2$), decomposed into Lorentzian curves, and FIG. 5d shows the micro-Raman spectrum of the P3MT nanowire (irradiated with a focused electron beam at a dose of $2.5 \times 10^{18}$ electrons/cm$^2$), decomposed into Lorentzian curves.

FIGS. 6(a)-6(c) show a Lorentzian curve for the micro-Raman spectrum of the single strand of the P3MT nanowire as a function of the dose of a focused electron beam, in which FIG. 6a shows a symmetric Cα=Cβ stretching mode, FIG. 6b shows a disordered mode, and FIG. 6c shows an anti-symmetric Cα=Cβ stretching mode.

FIGS. 7(a)-7(c) show the optical properties of P3MT nanowires not irradiated with a focused electron beam, in which FIG. 7a shows the UV-visible light absorption spectrum of P3MT nanowires (not irradiated with a focused electron beam) dispersed in a chloroform solution, FIG. 7b shows the laser confocal microscope (LCM) PL (photoluminescence) of the single strand of the P3MT nanowire not irradiated with a focused electron beam, and FIG. 7c shows the charge-coupled device (CCD) image of the P3MT nanowires not irradiated with a focused electron beam.

FIGS. 8(a)-8(c) show the optical properties of the P3MT nanowire irradiated with a focused electron beam, in which FIG. 8a shows the laser LCM PL spectra of the portion of the single strand of the P3MT nanowire that was not irradiated with a focused electron beam, the portion of the single P3MT nanowire strand that was irradiated with a focused electron beam at a dose of $7.5 \times 10^{16}$ electrons/cm$^2$, and the portion of the single P3MT nanowire strand that was irradiated with a focused electron beam at a dose of $2.5 \times 10^{17}$ electrons/cm$^2$, FIG. 8b shows a color charge-coupled device (CCD) image of the portion of the single P3MT nanowire strand that was irradiated with a focused electron beam at a dose of $7.5 \times 10^{16}$ electrons/cm$^2$, and FIG. 8c shows a color charge-coupled device (CCD) image of the portion of the single P3MT nanowire strand that was irradiated with a focused electron beam at a dose of $2.5 \times 10^{17}$ electrons/cm$^2$.

FIGS. 10(a)-10(h) are sets of figures showing the green-yellow color nano-barcodes fabricated by irradiating the P3MT nanowires with the focused electron beam at a dose of $7.5 \times 10^{16}$ electrons/cm$^2$, wherein FIGS. 10a, 10c, 10e and 10g show the color charge-coupled device images of the nano-barcodes, and FIGS. 10b, 10d, 10f and 10h show the LCM PL images of the nano-barcodes.

FIGS. 11(a)-11(f) show the green-red color nano-barcodes fabricated by irradiating the P3MT nanowires with the focused electron beam at a dose of $2.5 \times 10^{17}$ electrons/cm$^2$, in which FIGS. 11a, 11c and 11e show the color charge-coupled device images of the nano-barcodes, and FIGS. 11b, 11d and 11f shows the LCM PL images of the nano-barcodes.

FIGS. 12(a) and 12(b) show the charge-coupled device (CCD) image and three-dimensional laser confocal microscope (LCM) photoluminescence image of a TiO$_2$ nanowire treated with a focused electron beam according to one embodiment of the present invention, in which FIG. 12a shows the case in which focused electron beams having different densities ($1.0 \times 10^{17}$, $5.0 \times 10^{17}$ and $1.0 \times 10^{18}$ electrons/cm$^2$) were irradiated onto the same nanowire (the ratio of the length of the irradiated portions:the distance between the irradiated portions=7.5 μm:5.0 μm) and FIG. 12b shows the case in which the dose of a focused electron beam was set at $1.0 \times 10^{18}$ electrons/cm$^2$ (the ratio of the length of the irradiated portions:the distance between the irradiated portions=2.0 μm:1.5 μm).

FIGS. 14(a)-14(c) are sets of figures showing line profile curves of the LCM PL intensity as a function of the length of a TiO$_2$ nanowire treated with a focused electron beam according to one embodiment of the present invention, in which FIG. 14a shows the case in which the nanowire was treated with focused electron beams having three different doses, FIG. 14b shows the case in which the nanowire was treated with a focused electron beam at a dose of $5.0 \times 10^{18}$ electrons/cm$^2$, and FIG. 14c shows the case in which the nanowire was treated with a focused electron beam at a dose of $1.0 \times 10^{18}$ electrons/cm$^2$.

FIGS. 20(a) and 20(b) are sets of graphs showing the change in the Raman spectra (λex=514 nm) as a function of the dose of a focused electron beam in the single strand of PPy nanowire, the physical properties of which have been modified by the apparatus for modifying the physical properties of a conductive polymer nanostructure according to one embodiment of the present invention, in which

FIGS. 21(a)-21(d) are sets of graphs showing the results of decomposing the micro Raman spectrum of the single strand of the PPy nanowire (the physical properties of which have been modified by the apparatus for modifying the physical properties of a conductive polymer nanostructure according to one embodiment of the present invention) into Lorentzian curves, in which FIG. 21a is a graph for the pristine PPy nanowire, FIG. 21b is a graph for the case in which the dose of the focused electron beam is $5.0 \times 10^{16}$ electrons/cm$^2$, FIG. 21c is a graph for the case in which the dose of the focused electron beam is $5.0 \times 10^{17}$ electrons/cm$^2$, and FIG. 21d is a graph for the case in which the dose of the focused electron beam is $5.0 \times 10^{18}$ electrons/cm$^2$.

FIGS. 25(a) and 25(b) are sets of graphs showing the change in the current-voltage (I-V) characteristic curve of the single strand of the PPy nanowire, the physical properties of which have been modified by the apparatus for modifying the physical properties of a conductive polymer nanostructure according to one embodiment of the present invention, in which FIG. 25a depicts a graph showing the change in the current-voltage characteristic curve as a function of the change in the dose of the focused electron beam and FIG. 25b depicts a graph showing the change in the current-voltage characteristic curve as a function of the change in the number of irradiations with the focused electron beam.

DETAILED DESCRIPTION OF THE INVENTION

Hereinafter, an apparatus and method for modifying the physical properties of a nanostructure using a focused electron beam according to one embodiment of the present invention, and a nano-barcode and a serial-junction polymer nanowire which are fabricated using the method, will be described in detail. The present invention may, however, be embodied in many different forms and should not be construed as limited to the embodiments set forth herein; rather, these embodiments are provided so that this disclosure will be thorough and complete, and will fully convey the scope of the invention to those skilled in the art.

<Apparatus for Modifying the Physical Properties of Nano-Structure>

Figure 1:
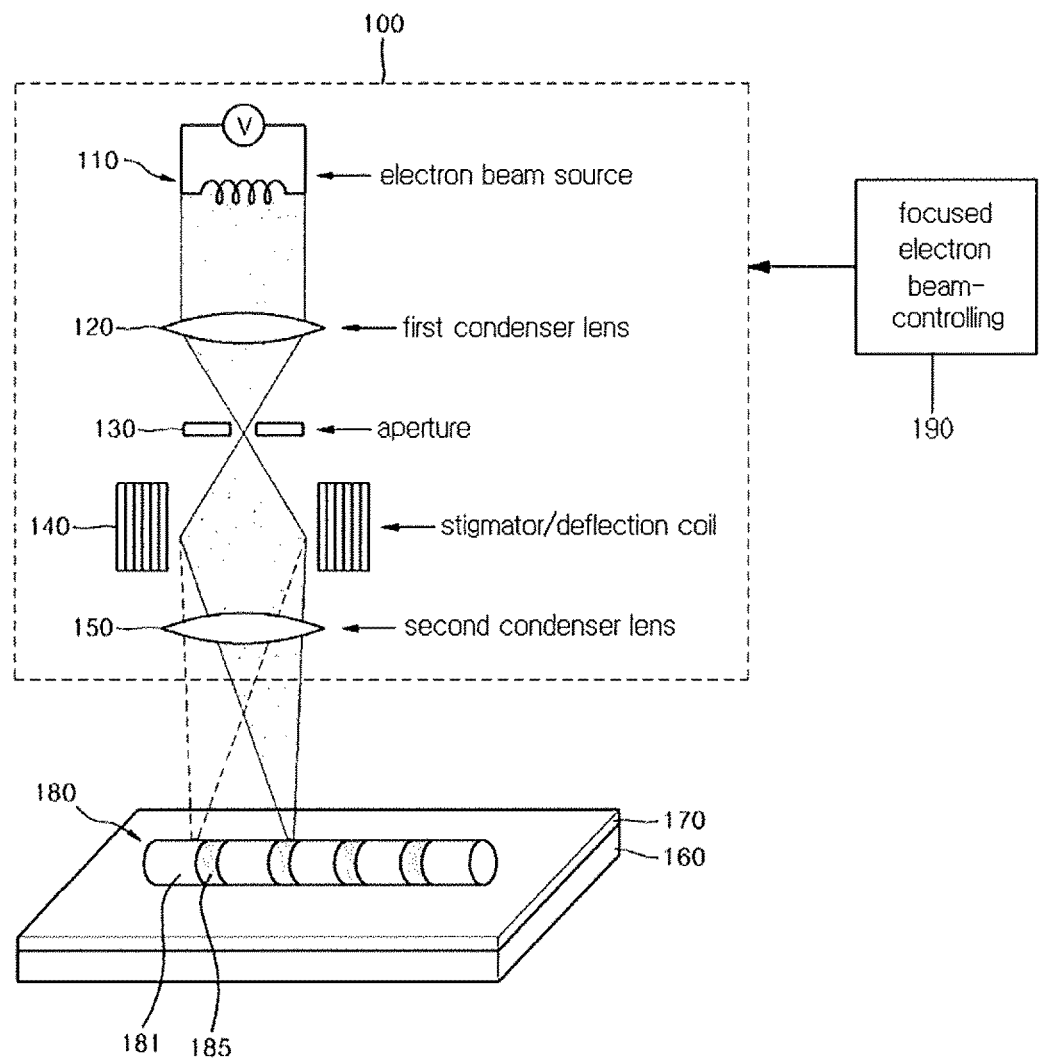
FIG. 1 shows the configuration of an apparatus for modifying the physical properties of a nano-structure using a focused electron beam according to one embodiment of the present invention.

FIG. 1 shows the configuration of an apparatus for modifying the physical properties of a nano-structure using a focused electron beam according to one embodiment of the present invention. As shown in FIG. 1, the apparatus according to this embodiment comprises a nano-structure 180, a focused electron beam-irradiating unit 100 and a focused electron beam-controlling unit 190.

In this embodiment, in order to induce a change in the physical properties of the nano-structure 180 by the focused electron beam-controlling unit 190, the nanoscale electron beam irradiated from the focused electron beam-radiating unit 100 is irradiated onto a portion of the nano-structure 180.

In FIG. 1, a nanowire-type structure is shown as the nano-structure 180, and an E-beam lithography system is shown as the system for generating a focused E-beam. FIG. 1 illustrates a method of modifying the physical properties of the nano-structure according to the present invention, but the scope of the present invention is not restricted or limited thereto.

Referring to FIG. 1, the method of modifying the physical properties of the nano-structure 180 according to the present invention comprises irradiating a portion of the nano-structure 180 with a focused E-beam. When the focused E-beam is radiated onto a portion of the nano-structure 180, the physical properties of the portion 185 that is irradiated with the focused E-beam are modified so that they are distinguished from the physical properties of the portion 181 that is not irradiated with the focused E-beam. By doing so, the physical properties of a portion of the nano-structure 180 can be modified. Particularly, the focused E-beams can be irradiated so that the portion 185 that is irradiated with the focused E-beam and the portion 181 that is not irradiated with the focused E-beam differ from each other with respect to at least one of their structural properties, photoluminescent properties, lattice defects, doped states and electrical properties, whereby the physical properties of a portion of the nano-structure 180 can be modified.

At this time, the correlation between the physical properties of the nano-structure 180 as a function of the conditions of focused E-beam irradiation can be analyzed, and, based on the analysis results, a focused E-beam can be irradiated onto the nano-structure 180. As such, when the focused E-beam is irradiated on the basis of the results of analysis of the correlation between the physical properties of the nano-structure 180 as a function of the conditions of focused E-beam irradiation, the physical properties of the nano-structure 180 can be modified as desired, and the physical properties of the nano-structure 180 can be quantitatively controlled on the nano scale.

According to the present invention, the physical properties of a portion of the inorganic nano-structure 180, which is formed integrally of a single material, can be modified by irradiation with the focused E-beam. Particularly, the use of the focused E-beams makes it possible to modify the physical properties of the nano-structure 180 on the nano scale, thus making it possible to use the nano-structure 180 in various fields.

In this embodiment, in order to modify the physical properties of the nanostructure 180, as shown in FIG. 1, the nanostructure 180 is placed on a substrate 180, and then a focused E-beam is irradiated onto a portion of the nanostructure 180. At this time, it is very important to accurately irradiate the focused E-beam onto the portion of the nanostructure for which the physical properties are to be modified. For this purpose, the nanostructure 180 is placed with respect to a pattern 170 formed on the substrate 160. When the pattern 170 is formed on the substrate 160 and the nanostructure 180 is then placed with respect to the pattern 170, accurate irradiation of the focused E-beam onto the nanostructure 180 becomes easy. The pattern 170 can be made of a conductive material such as gold (Au).

In this regard, electron beams can be classified, according to the size and focus of the electron beams, into an unfocused electron beam, which is not focused, and a focused electron beam, which can be focused. The unfocused electron beam can be adjusted to a size of 20×8 cm$^2$ or more so that it can be used to treat several strands of nanomaterial or a large-area sample at the same time. Conversely, the focused electron beam that is used in this embodiment is focused by a condenser lens and has a diameter of 1000 nm or less, and thus it is possible to accurately control the position to be irradiated with the focused electron beam.

This focused electron beam is generated by the focused electron beam-irradiating unit 100 and is irradiated onto the nanostructure 180. The focused electron beam-irradiating unit 100 that is used in the present invention may be a scanning electron microscope (SEM), a transmission electron microscope (TEM), or an electron beam lithography system. In this embodiment, the electron beam lithography system is used.

The electron beam generated in an E-beam source 110 is focused by a first condenser lens 120. The electron beam that has passed through an aperture 130 is bent toward a desired position by a stigmator/deflection coil 140, after which the beam is focused again by a second condenser lens 150 and is irradiated onto the nanostructure 180.

The nanostructure 180 may be a π-conjugated polymer nanostructure or an inorganic nanostructure, and may be formed of a light-emitting polymer material or a conductive polymer material, depending on the properties thereof.

Particularly, the π-conjugated polymer nanostructure may be formed of at least one polymer selected from the group consisting of polythiophene, poly(p-phenylenevinylene), polythiophenevinylene, poly(p-phenylene), poly(p-phenylacetylene), and derivatives thereof. Also, the inorganic nanostructure may be formed of titanium dioxide ($TiO_2$), zinc oxide (ZnO) or silicon dioxide ($SiO_2$).

In addition, the nanostructure 180 may be a nanostructure comprising at least one selected from among nanowires, nanorods, nanotubes and nanoplates.

The energy of the focused electron beam is not especially limited, but is set at a value of about 30 keV in this embodiment, and the dose of the focused electron beam may be set within the range from $1.0 \times 10^{12}$ electrons/cm$^2$ to $1.0 \times 10^{22}$ electrons/cm$^2$. In this regard, as the energy of the focused energy beam increases, the dose of the focused electron beam may decrease. Also, the diameter of the focused electron beam may be set within the range from 1 nm to 1000 nm. The conditions of the focused electron beam, such as the energy, dose and diameter of the focused electron beam, vary depending on whether and how the physical properties of the nanostructure 180 are modified. For example, where the nanostructure 180 is made of a light-emitting polymer material, the energy and dose of the focused electron beam may be set at low values in order to slightly modify the physical properties of the polymer material. In contrast, the energy and dose of the focused electron beam may be set at high values in order to greatly modify the physical properties of the light-emitting polymer material.

Thus, the physical properties of the nanostructure 180 can be modified as desired by suitably controlling the energy and dose of the focused electron beam. However, as the energy of the focused electron beam increases, electron beams having a lower dose may be used, and as the energy of the focused electron beam decreases, a focused electron beam having a higher dose may be used, thereby modifying the physical properties of the nanostructure 180. Also, where the size of the portion of the nanostructure 180, the physical properties of which are to be modified, is large, the diameter of the focused electron beam may be set at a large value, and where the size of the portion is small, the diameter of the focused electron beam may be set at a small value.

The electron beam that has been focused as described above is irradiated vertically onto the nanostructure 180 as shown in FIG. 1, and the diameter of the focused electron beam is set within the range from about 1 nm to 1000 nm, and thus the physical properties of the desired portion of the nanostructure 180 can be modified on the nano scale. When the photoluminescent properties of the light-emitting polymer nanostructure or inorganic nanostructure are modified on the nano scale as described above, a nano-barcode can be fabricated, and in the case of the conductive polymer nanostructure, a serial-junction nanowire can be fabricated.

Particularly, among the nanostructures 180, π-conjugated light-emitting polymer nanowires may be nanowires made of P3MT (poly(3-methylthiophene)). Also, light-emitting polymer materials such as π-conjugated light-emitting polymer nanowires may be doped with a dopant, and the optical and electrical properties of the light-emitting polymer material may vary depending on the degree of doping. π-conjugated light-emitting polymer nanowires can be fabricated using a nanoporous template, but the fabrication method thereof is not specifically limited. In addition, π-conjugated light-emitting polymer nanowires can also be fabricated using a template wetting method, a self-assembly method, an electrospinning method or the like.

FIG. 2 is a set of figures schematically showing a process of fabricating π-conjugated light-emitting polymer nanowires using a nanoporous aluminum oxide template. Referring to FIG. 2a, the nanoporous aluminum oxide template 200 that is used as a medium for forming π-conjugated light-emitting polymer nanowires 220 is first prepared. As the nanoporous aluminum oxide template 200, a nanoporous aluminum oxide template having an electrode 200 formed on one side thereof may be used. However, the scope of the present invention is not limited thereto, and a nanoporous aluminum oxide template 200 not having an electrode 210 formed on one side thereof may, if necessary, be used.

The electrode 210 can be used as a working electrode when the π-conjugated light-emitting polymer nanowires 220 are fabricated using, for example, an electrochemical polymerization process. The material of the electrode 210 is not especially limited, but the electrode 210 may be made of, for example, one or a combination of two or more selected from among highly conductive materials, including gold, silver, platinum, copper, nickel, stainless steel, indium tin oxide (ITO) and the like.

After the nanoporous aluminum oxide template 200 having the electrode 210 formed on one side thereof has been fabricated, as shown in FIG. 2b, the π-conjugated light-emitting polymer nanowires 220 are allowed to grow within the pores of the nanoporous aluminum oxide template 200.

For this purpose, a raw material composition which is used as a raw material for forming the π-conjugated light-emitting polymer nanowires 220 can be prepared. The components of the raw material composition for π-conjugated light-emitting polymer nanowires can vary depending on the specific method for growing the π-conjugated light-emitting polymer nanowires 220. For example, when the π-conjugated light-emitting polymer nanowires 220 are to be polymerized by an electrochemical polymerization process or a chemical polymerization process, the raw material composition for π-conjugated light-emitting polymer nanowires can comprise an organic solvent, a monomer and a dopant.

After the raw material composition for π-conjugated light-emitting polymer nanowires has been prepared, for example, the raw material composition for π-conjugated light-emitting polymer nanowires is injected into the pores of the nanoporous aluminum oxide template 200, and is then subjected to an electrochemical polymerization process to form π-conjugated light-emitting polymer nanowires 220. In the electrochemical polymerization process, the chemical bonding between the monomer units can be promoted using the dopant, and a π-conjugated main chain in which a single bond and a double bond are repeated between the carbon atoms of the monomers can be formed, thereby forming a polymer. The electrochemical polymerization process that is used in the present invention may be a constant current electrolysis (CCE) process, in which a polymerization reaction is carried out by continuously applying a constant current between a working electrode and a counter electrode, or a constant potential electrolysis (CPE) process, in which a polymerization reaction is carried out by maintaining the voltage between a working electrode and a reference electrode, or between a working electrode and a counter electrode, at a constant level.

After the π-conjugated light-emitting polymer nanowires 220 have been formed, as shown in FIG. 2c, the nanoporous aluminum oxide template 200 is removed. In order to remove the nanoporous aluminum oxide template 200, the nanoporous aluminum oxide template 200 may, for example, be immersed in an aqueous solution of hydrofluoric acid (HF) or sodium hydroxide (NaOH). Alternatively, a method of dropping an aqueous solution of hydrofluoric acid (HF) or sodium hydroxide (NaOH) onto the surface of the nanoporous aluminum oxide template 200 may also be used. After the nanoporous aluminum oxide template 200 has been removed, the material remaining on the π-conjugated light-emitting polymer nanowires 220 is removed, for example, using distilled water or the like, after which the π-conjugated light-emitting polymer nanowires 220 are dried in a vacuum oven. In this way, the π-conjugated light-emitting polymer nanowires 220 can be obtained.

The π-conjugated light-emitting polymer nanowire 220 fabricated according to the above-described method is placed on the substrate 160 having the pattern 170 formed thereon, after which the desired portion of the π-conjugated light-emitting polymer nanowire 220 is irradiated with the focused electron beam using a focused electron beam-generating unit 100, thereby forming a π-conjugated light-emitting polymer nanowire in which the physical properties of the portion irradiated with the focused electron beam have been modified.

<A Method of Modifying the Physical Properties of a Light-Emitting Polymer Nanostructure and a Nano-Barcode>

Examples 1 to 3

1. Fabrication of P3MT Nanowires

A nanoporous aluminum oxide template (diameter: 47 mm, and pore size: 0.2 μm; purchased from Whatman) was prepared. Then, gold to be used as an electrode was deposited on one side of the nanoporous aluminum oxide template, after which the deposited gold was attached to stainless steel and used as a background material for the synthesis of P3MT nanowires. Then, an organic solvent, a monomer and a dopant were mixed with each other and magnetically stirred for 30 minutes or more to prepare a raw material composition for π-conjugated light-emitting polymer nanowires. Here, the organic solvent that was used was acetonitrile, the monomer that was used was 3-methylthiophene (3-MT), a thiophene derivative, and the dopant that was used was tetrabutylammonium hexafluorophosphate. Then, the raw material composition for π-conjugated light-emitting polymer nanowires was injected into the pores of the nanoporous aluminum oxide template, and was then subjected to an electrochemical polymerization process to form P3MT nanowires. Then, the nanoporous aluminum oxide template was removed by immersion in an aqueous solution of hydrofluoric acid. The material remaining on the P3MT nanowires was washed away with distilled water, after which the P3MT nanowires were dried in a vacuum oven and then treated ultrasonically, thus collecting the nanowires as individual strands.

2. Irradiation of P3MT Nanowires with Focused Electron Beam

The P3MT nanowires obtained according to the above-described method were placed on a substrate having a pattern formed thereon. In this regard, the substrate used was a p-doped silicon substrate, and the pattern on the substrate was formed by forming a desired pattern using a photolithography process and then depositing gold thereon. Then, a portion of the P3MT nanowire was irradiated with the focused electron beam using an electron beam-generating unit that is capable of producing a focused electron beam. The energy and dose of the focused electron beam used in Examples 1 to 3 are shown in Table 1 below.

TABLE 1

| | Example 1 | Example 2 | Example 3 |
|---|---|---|---|
| Energy of focused electron beam (keV) | 30 | 30 | 30 |
| Dose of focused electron beam (electrons/cm$^2$) | $7.5 \times 10^{16}$ | $2.5 \times 10^{17}$ | $2.5 \times 10^{18}$ |

3. Analysis of P3MT Nanowires Irradiated with Focused Electron Beam

The following observations were made on the P3MT nanowires: a scanning electron microscope photograph of the portion of the P3MT nanowires that was irradiated with the electron beam according to Examples 1 to 3; the micro-Raman spectrum of the single strand of the P3MT nanowire; the micro-Raman spectrum of the single strand of the P3MT nanowire, decomposed into Lorentzian curves; Lorentzian curves for the micro-Raman spectrum of the single strand of the P3MT nanowire; the UV-visible light absorption spectrum of the P3MT nanowire; the laser confocal microscope (LCM) PL (photoluminescence) spectrum of the single strand of the P3MT nanowire; and a charge-coupled device (CCD)

image of the P3MT nanowires. For comparison, the above-described observations were also made on the pristine portion that was not irradiated with the focused electron beam.

Analysis of Scanning Electron Microscope Photographs

Figure 3:
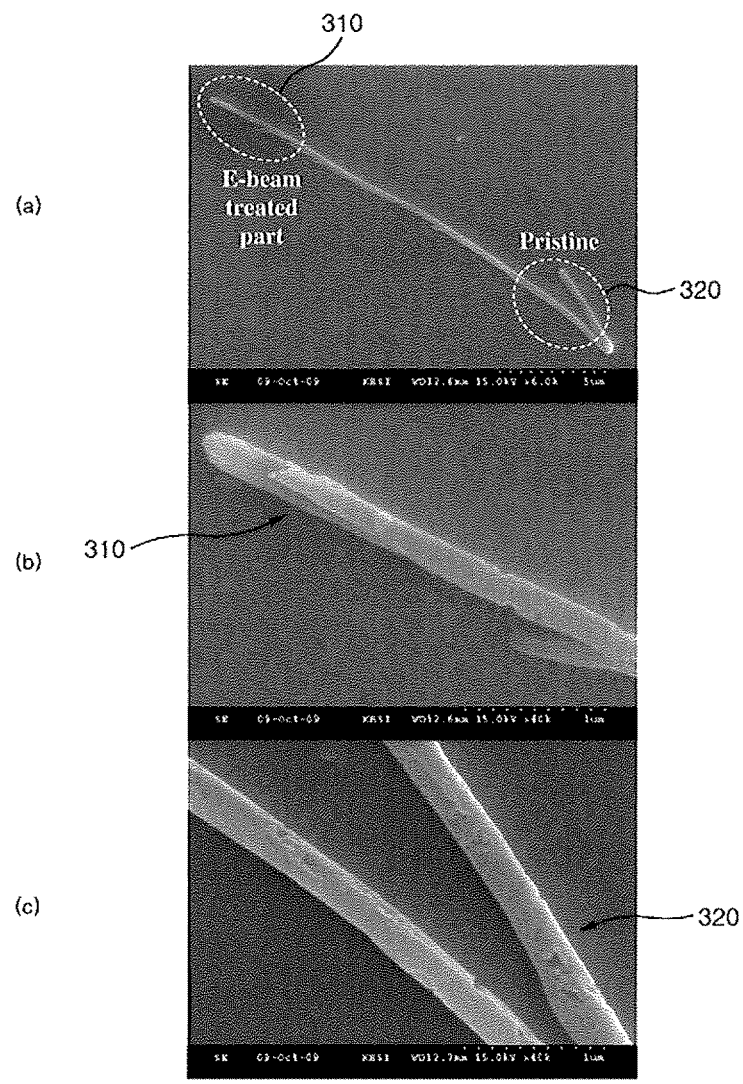

FIG. 3 is a set of photographs showing the results of irradiation of a portion of the P3MT (poly(3-methylthiophene)) nanowire with a focused electron beam according to one embodiment of the present invention. Specifically, FIG. 3a is a scanning electron microscope photograph showing an entire single strand of the P3MT nanowire, FIG. 3b is an enlarged photograph of the portion irradiated with the focused electron beam, and FIG. 3c is an enlarged photograph of the portion not irradiated with the focused electron beam. In FIG. 3, the portion indicated by reference numeral 310 is the portion that was irradiated with the focused electron beam, and the portion indicated by reference numeral 320 corresponds to the portion that was not irradiated with the focused electron beam, that is, the pristine portion.

Referring to FIG. 3, it can be seen that the P3MT nanowire has a length of about 20 μm and a diameter of about 200 nm. As shown in FIG. 3, it can be seen that the surface state of the portion 310 irradiated with the focused electron beam does not greatly differ from that of the pristine portion 320. However, surface irregularities were observed throughout the P3MT nanowire, and such surface irregularities are not attributable to irradiation with the focused electron beam, but result from the influence of the ultrasonic treatment process that is carried out during the process of collecting the P3MT nanowires as separated strands from the electrode.

Figure 4:
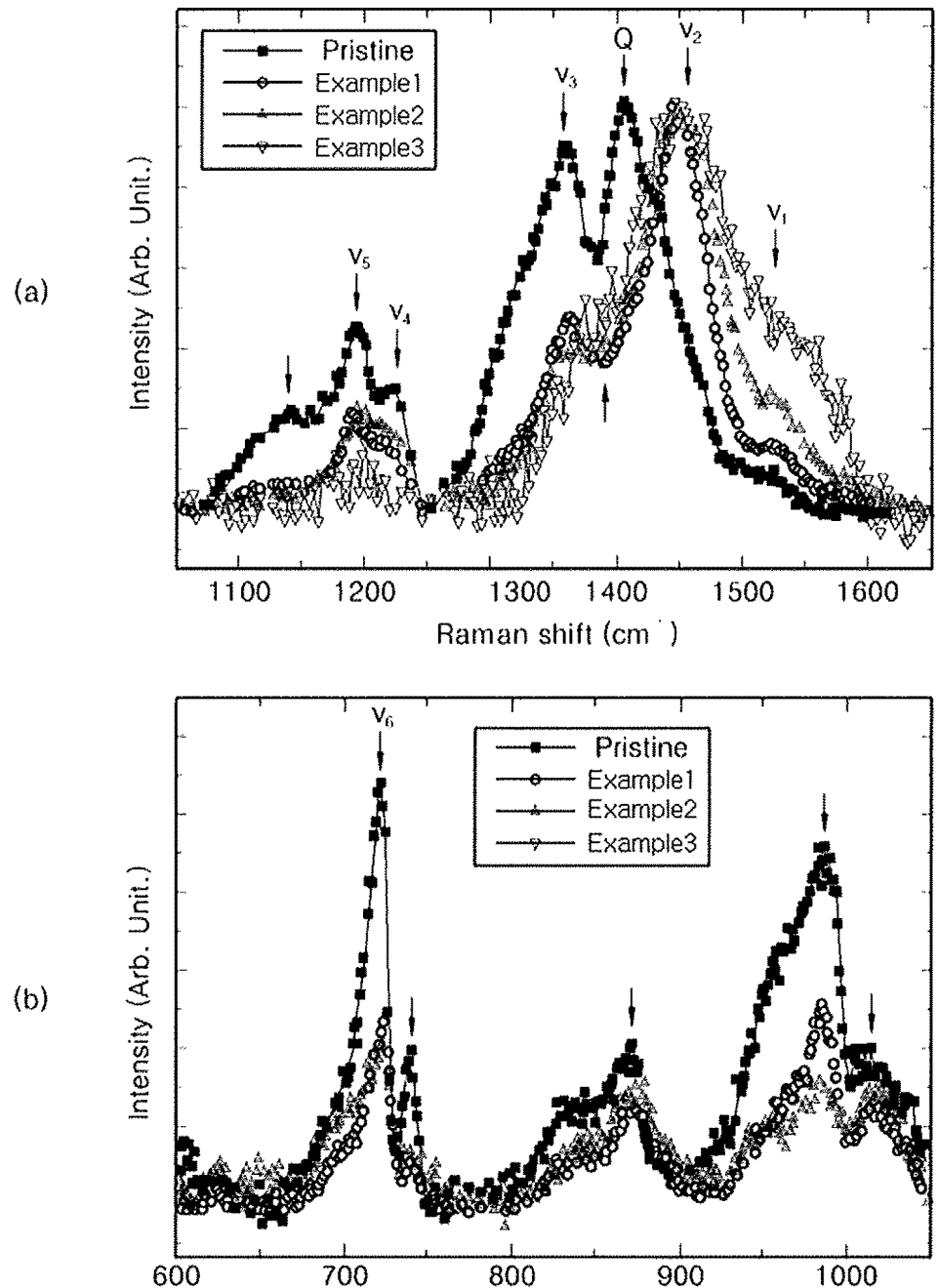

Analysis of the Structure of P3MT Nanowires Resulting from Irradiation with a Focused Electron Beam and the Doped State Thereof FIG. 4 is a set of figures showing the micro-Raman spectrum ($\lambda$ex=633 nm) of a single strand of the P3MT nanowire as a function of the dose of a focused electron beam. Specifically, FIG. 4a shows a micro-Raman spectrum in the range from 1050 $cm^{-1}$ to 1650 $cm^{-1}$, and FIG. 4b shows a micro-Raman spectrum in the range from 600 $cm^{-1}$ to 1050 $cm^{-1}$.

The characteristic Raman peaks of the pristine P3MT portion, which was not irradiated with a focused electron beam, are shown in Table 2 below.

TABLE 2

| Peak positions ($cm^{-1}$) | Characteristic Raman vibrational modes | Marks |
|---|---|---|
| 722 | Ring deformation $C_\alpha$—S—$C_{\alpha'}$ | $V_6$ |
| 870 | Ring C—S stretching | |
| 977 | Ring-$CH_3$ stretching | |
| 1191 | $C_\beta$—H bending | $V_5$ |
| 1214 | $C_\alpha$—$C_{\alpha'}$ stretching | $V_4$ |
| 1355 | $C_\beta$—$C_{\beta'}$ ring stretching | $V_3$ |
| ~1410 | Quinoid | Q |
| 1455 | Symmetric $C_\alpha$—$C_\beta$ ring stretching | $V_2$ |
| 1530 | Anti-symmetric $C_\alpha$—$C_\beta$ ring stretching | $V_1$ |

Referring to FIG. 4 and Table 2 above, the analysis results for the characteristic Raman peaks of the P3MT nanowire revealed that the monomer 3-MT was polymerized into a polymer.

The change in the micro-Raman spectrum of the P3MT nanowire, caused by irradiation with the focused electron beam, was observed throughout the entire wavenumber range, and it can be seen that, as the dose of the focused electron beam increased (Example 1→Example 3), the micro-Raman spectrum gradually changed. For further quantitative analysis, the micro-Raman spectrum shown in FIG. 4 was decomposed into Lorentzian curves in the range from 1050 $cm^{-1}$ to 1690 $cm^{-1}$, and the decomposition results are shown in FIG. 5 and FIG. 6.

Figure 5:
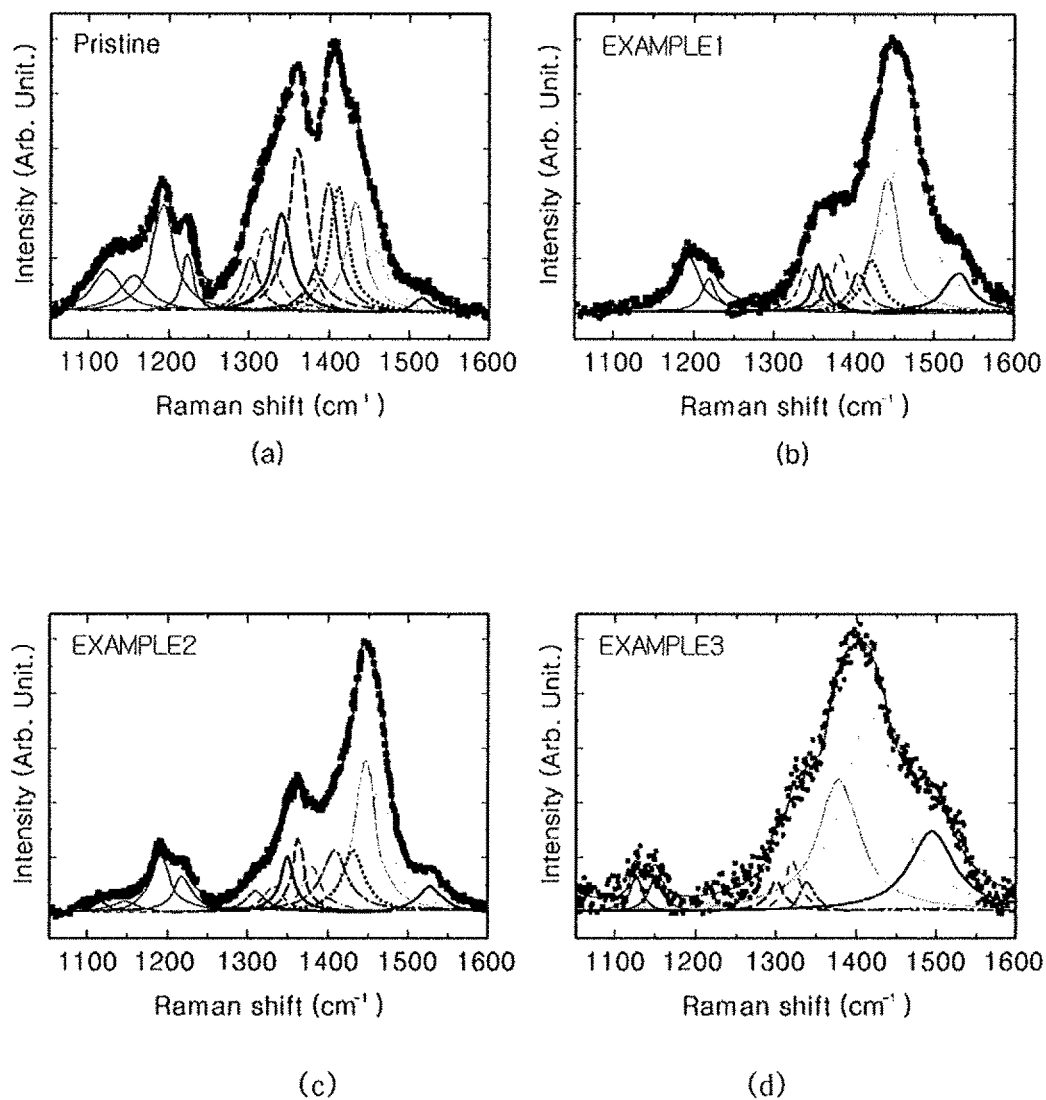
Figure 6:
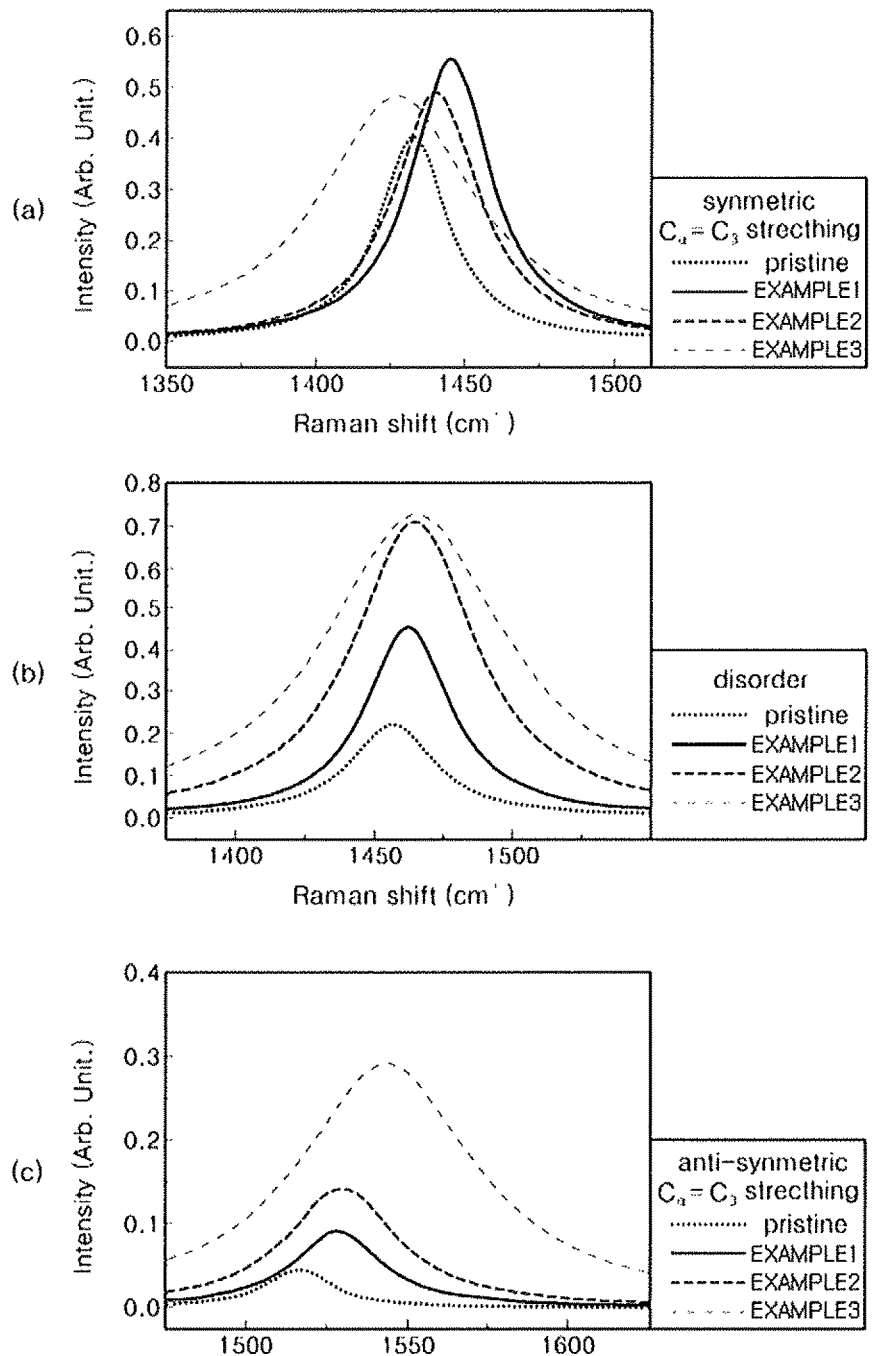

FIG. 5 is a set of figures showing the micro-Raman spectrum of the single strand of the P3MT nanowire, decomposed into Lorentzian curves. Specifically, FIG. 5a shows the micro-Raman spectrum of the P3MT nanowire (not irradiated with a focused electron beam), decomposed into Lorentzian curves; FIG. 5b shows the micro-Raman spectrum of the P3MT nanowire (irradiated with a focused electron beam at a dose of $7.5 \times 10^{16}$ electrons/$cm^2$), decomposed into Lorentzian curves; FIG. 5c shows the micro-Raman spectrum of the P3MT nanowire (irradiated with a focused electron beam at a dose of $2.5 \times 10^{17}$ electrons/$cm^2$), decomposed into Lorentzian curves; and FIG. 5d shows the micro-Raman spectrum of the P3MT nanowire (irradiated with a focused electron beam at a dose of $2.5 \times 10^{18}$ electrons/$cm^2$), decomposed into Lorentzian curves.

As shown in FIG. 5, it can be seen that, as the dose of the focused electron beam increased (Example 1→Example 3), the characteristic Raman peaks of the P3MT nanowire, which occurred in the ν3, ν4 and ν5 modes, gradually decreased. This indicates that the interaction between the focused electron beam and the $C_\alpha$-S-$C_{\alpha'}$ ring of the P3MT nanowire occurred, thus causing structural modification of the polymer main chain.

Meanwhile, the ratio of the Q peak of the P3MT nanowire relative to the ν2 peak of the P3MT nanowire, (Q/ν2), provides quantitative information about the doped state of the P3MT nanowire. As shown in FIG. 5, it can be seen that, as the dose of the focused electron beam increased (Example 1→Example 3), the Q peak/ν2 peak ratio gradually decreased. This indicates that the P3MT nanowire was switched from the doped state to the dedoped state by the interaction between the focused electron beam and the negatively charged dopant ions.

FIG. 6 shows a Lorentzian curve for the micro-Raman spectrum of the single strand of the P3MT nanowire as a function of the dose of a focused electron beam. Specifically, FIG. 6a shows a symmetric $C_\alpha$=$C_\beta$ stretching mode; FIG. 6b shows a disordered mode; and FIG. 6c shows an anti-symmetric $C_\alpha$=$C_\beta$ stretching mode.

As can be seen in FIG. 6, it can be seen that, as the dose of the focused electron beam increased (Example 1→Example 3), the intensity and full-width-half-maximum of the disordered mode (FIG. 6b) and the anti-symmetric $C_\alpha$-$C_\beta$ stretching mode (FIG. 6c) gradually increased. This suggests that the structural properties of the P3MT nanowire were modified by irradiation with the focused electron beam.

As can be seen from the results shown in FIGS. 4 to 6 and Table 2, controlling the conditions of focused electron beam irradiation makes it possible to control the doped state and structural properties of the portion of the P3MT nanowire that is irradiated with the focused electron beam. Thus, when the conditions of irradiation with a focused electron beam and the position to be irradiated with the focused electron beam are suitably selected, the physical properties of the P3MT nanowire can be modified to realize desired properties. Namely, the doped state and structural properties of the portion of the nanowire for which the physical properties are to be modified can be modified as desired. Particularly, the use of the focused electron beam makes it possible to modify the doped state and structural properties of the P3MT nanowire on the nano scale. Also, the change in the structural properties of the P3MT nanowire can be recognized as a Raman signal. The use of such results makes it possible to obtain a nano-barcode that exhibits a Raman signal as the change in the structural properties of the P3MT nanowire, which results from irradiation with a focused electron beam.

Analysis of the Change in Optical Properties of P3MT Nanowire that Results from Irradiation with a Focused Electron Beam In this embodiment, the physical properties of the P3MT nanowire can be modified by irradiating the P3MT nanowire with a focused electron beam. Particularly, the optical properties of a portion of the P3MT nanowire can be modified on the nano scale. The P3MT nanowire, the optical properties of a portion of which have been modified as described above, can be used as a nano-barcode.

Figure 7:
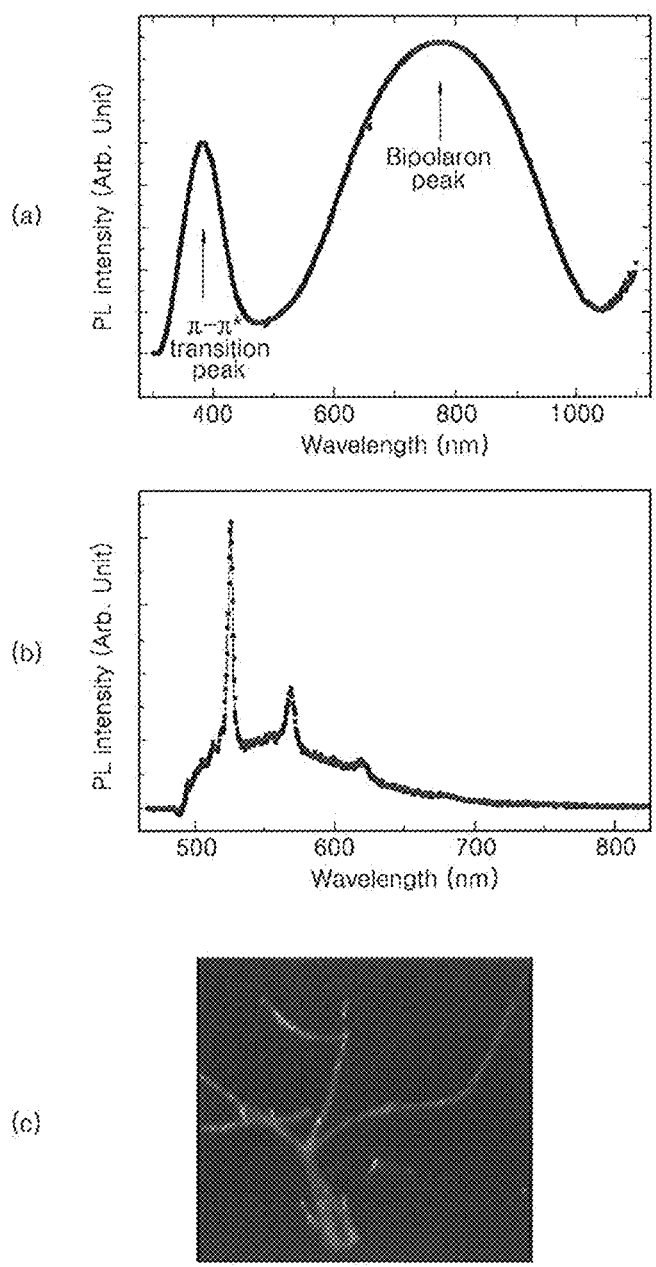

FIG. 7 shows the optical properties of P3MT nanowires that have not been irradiated with a focused electron beam. Specifically, FIG. 7a shows the UV-visible light absorption spectrum of P3MT nanowires (not irradiated with a focused electron beam) dispersed in a chloroform solution; FIG. 7b shows the laser confocal microscope (LCM) PL (photoluminescence) spectrum of a single strand of the P3MT nanowire not irradiated with a focused electron beam; and FIG. 7c shows the charge-coupled device (CCD) image of the P3MT nanowire not irradiated with a focused electron beam. The LCM PL spectrum in FIG. 7b was measured using light having a wavelength of 488 nm, and the CCD image in FIG. 7c was measured using light having a wavelength of 430 nm. Also, in order to quantitatively analyze the change in the optical properties of the P3MT nanowire, the LCM PL spectrum in FIG. 7b was normalized based on the maximum LCM PL peak intensity. At this time, the anti-Stokes' Raman modes observed at 525.4 nm and 568.5 nm were excluded from the normalization process.

As can be seen in FIG. 7a, the π–π* transition peak of the pristine P3MT nanowire not irradiated with the focused electron beam was observed at around 380 nm, and the bipolaron peak produced by doping was observed at around 780 nm. Also, the bipolaron peak had a relatively wide full-width-half-maximum, and the intensity of the bipolaron peak was observed to be higher than that of the transition peak. This suggests that the pristine P3MT nanowire is in a relatively highly doped state.

As can be seen in FIG. 7b, the LCM PL peak of the pristine P3MT nanowire showed the highest intensity in the range from 520 nm to 530 nm, which was highly consistent with the PL color of the pristine P3MT nanowire, observed in the CCD image in FIG. 7c.

FIG. 8 shows the optical properties of the P3MT nanowire irradiated with a focused electron beam. Specifically, FIG. 8a shows the laser LCM PL spectra of the portion of the single strand of the P3MT nanowire that was not irradiated with the focused electron beam, the portion of the single P3MT nanowire strand that was irradiated with a focused electron beam at a dose of $7.5\times10^{16}$ electrons/cm$^2$, and the portion of the single P3MT nanowire strand that was irradiated with a focused electron beam at a dose of $2.5\times10^{17}$ electrons/cm$^2$; FIG. 8b shows a color charge-coupled device (CCD) image of the portion of the single P3MT nanowire strand that was irradiated with a focused electron beam at a dose of $7.5\times10^{16}$ electrons/cm$^2$; and FIG. 8c shows a color charge-coupled device (CCD) image of the portion of the single P3MT nanowire strand that was irradiated with a focused electron beam at a dose of $2.5\times10^{17}$ electrons/cm$^2$. The LCM PL spectrum in FIG. 8a was measured using light having a wavelength of 488 nm, and the CCD images in FIGS. 8b and 8c were measured using light having a wavelength of 430 nm. Also, in order to quantitatively analyze the change in the optical properties of the P3MT nanowire, the LCM PL spectrum in FIG. 8a was normalized based on the maximum LCM PL peak intensity of the pristine P3MT nanowire. In FIG. 8b, the portion indicated by reference numeral 810 and the portion indicated by reference numeral 820 correspond to the portions irradiated with the focused electron beam.

As can be seen in FIG. 8a, as the dose of the focused electron beam increased (pristine→Example 1→Example 2), the LCM PL intensity gradually increased. In the case of Example 1, in which the dose of the focused electron beam was $7.5\times10^{16}$ electrons/cm$^2$, the LCM PL intensity increased up to 25 times the LCM PL intensity of the pristine P3MT nanowire. Also, in the case of Example 2, in which the dose of the focused electron beam was $2.5\times10^{17}$ electrons/cm$^2$, the LCM PL intensity increased up to 50 times the LCM PL intensity of the pristine P3MT nanowire.

Also, it can be seen that the position of the LCM PL peak was red-shifted as the dose of the focused electron beam increased (pristine→Example 1→Example 2). Namely, the LCM PL peak of the pristine P3MT nanowire, which had been observed in the range from 520 nm to 530 nm, was observed at around 560 nm in the case of the nanowire of Example 1 (dose of the focused electron beam: $7.5\times10^{16}$ electrons/cm$^2$) and in the range from 590 nm to 600 nm in the nanowire of Example 2 (dose of the focused electron beam: $2.5\times10^{17}$ electrons/cm$^2$). This red transition of the LCM PL peak was highly consistent with the color CCD images shown in FIGS. 8b and 8c. Namely, it could be observed that the color CCD image of the pristine P3MT nanowire was green (FIG. 7c), but the color CCD image of the nanowire of Example 1 (dose of the focused electron beam: $7.5\times10^{16}$ electrons/cm$^2$) was yellow (FIG. 8b), and the color CCD image of the nanowire of Example 2 (dose of the focused electron beam: $2.5\times10^{17}$ electrons/cm$^2$) was orange-red (FIG. 8c). As described above, when the focused electron beam is irradiated onto a P3MT nanowire, the optical properties (such as photoluminescent properties) of the P3MT nanowire will be changed. The changes in the optical properties of a P3MT nanowire, which result from irradiation with the focused electron beam, are summarized in Table 3 below.

TABLE 3

| Optical properties | Pristine | Example 1 | Example 2 |
|---|---|---|---|
| Relative intensity of maximum LCM PL | 1 | ~25 | ~50 |
| Position of highest LCM PL | 520-530 nm | 560 nm | 590-600 nm |
| PL color | Green | Yellow | Orange-red |

From the above results, it can be seen that, when a portion of a P3MT nanowire is irradiated with the focused electron beam, the color of that portion can be changed. For example, when a portion of a P3MT nanowire is irradiated with a focused electron beam at a dose of $7.5\times10^{16}$ electrons/cm$^2$, as shown in Example 1, the PL color of the portion (pristine portion) that is not irradiated with the focused electron beam will remain green, but the PL color of the portion irradiated with the focused electron beam will turn yellow. When a portion of the P3MT nanowire is irradiated with a focused electron beam at a dose of $2.5\times10^{17}$ electrons/cm$^2$, as shown in Example 2, the PL color of the portion (pristine portion) not irradiated with the focused electron beam will remain green, but the PL color of the portion irradiated with the focused electron beam will turn red. Namely, the use of the focused electron beam makes it possible to change a specific portion of a single P3MT nanowire strand. Furthermore, when the portion to be irradiated with the focused electron beam, and the energy and dose of a focused electron beam, etc., are controlled, the color of a specific portion of the P3MT nanowire can be controlled to realize a desired color, and the intensity of the PL peak can also be controlled to realize a desired intensity. This makes it possible to use the P3MT nanowire as a nano-barcode. Namely, the use of focused electron beam irradiation makes it possible to allow a single P3MT nanowire either to emit different PL colors on the nano scale or to have different PL intensities, thereby making it possible to easily fabricate a nano-barcode.

Such changes in the optical properties of a P3MT nanowire, which result from irradiation with a focused electron beam, are highly consistent with the above-described results of the micro-Raman spectrum. The relatively highly doped state of the pristine P3MT nanowire is changed to the dedoped state by irradiation with the focused electron beam. Due to the dedoping of the P3MT nanowire, the energy band gap of the P3MT nanowire decreases, which explains well the phenomenon in which the PL color of the nanowire is red-shifted as a result of irradiation with the focused electron beam. Also, due to the dedoping of the P3MT nanowire, mid-gap states such as bipolarons, which interfere with the PL process, decrease, which explains well the phenomenon in which the LCM PL intensity increases as a result of irradiation with the focused electron beam. In the case of general light-emitting polymers, polarons, bipolarons and the like resulting from doping interfere with the PL process, which takes place while excitons formed by light degrade, thereby reducing the light-emitting efficiency of the polymers. However, when a light-emitting polymer is irradiated with a focused electron beam as described in this embodiment, the concentration of polarons or bipolarons in the polymer will be reduced. Unlike the phenomenon in which the light-emitting efficiency decreases in the highly doped state, the phenomenon of the red shift of the PL peak appears as a result of an increase in light-emitting efficiency and a decrease in $\pi-\pi^*$ band gap of the portion irradiated with a focused electron beam.

Hereinafter, a method of fabricating a nano-barcode using the phenomenon in which a portion of a light-emitting polymer material is modified by irradiation with a focused electron beam, and a nano-barcode fabricated thereby, will be described.

When the structural properties of a π-conjugated light-emitting polymer nanowire are modified by irradiation with a focused electron beam, it is possible to fabricate a nano-barcode that exhibits a Raman signal as the modified structural property. Also, when the photoluminescent properties of a π-conjugated light-emitting polymer nanowire are modified by irradiation with the focused electron beam, a nano-barcode that exhibits only the modified photoluminescent properties can be prepared. In this regard, the nano-barcodes that exhibit the modified photoluminescent properties can be divided into a nano-barcode that exhibits the change in the PL color, and a nano-barcode that exhibits the change in the PL intensity (change in brightness). In particular, the nano-barcode that exhibits the change in the PL color can be embodied as a color nano-barcode. In the nano-barcode fabricated according to the above method, the physical properties of the π-conjugated light-emitting polymer nanowire differ between portions of the nanowires, but the nanowire is formed of a single material. Specifically, the structural properties and photoluminescent properties of the nano-barcode according to the present invention are different between portions of the π-conjugated light-emitting polymer nanowire made of a single material.

Hereinafter, a method of fabricating a color nano-barcode that exhibits, as the change in the PL color, the change in the photoluminescent properties of a π-conjugated light-emitting polymer nanowire, which results from irradiation with a focused electron beam, and a color nano-barcode fabricated thereby, will be described in detail.

As described above, when the conditions of irradiation with a focused electron beam are suitably selected, a π-conjugated light-emitting polymer nanowire, in which portions having different PL colors are alternately formed, can be fabricated, and this π-conjugated light-emitting polymer nanowire can be used as a color nano-barcode. For example, the dose and energy of focused energy beams can be changed so that the portion irradiated with the focused electron beam has a desired PL color and a desired PL intensity. Also, the diameter of the focused electron beam can be changed so that the area of the π-conjugated light-emitting polymer nanowire that is irradiated with the focused electron beam can be changed, thereby controlling the size of the light-emitting region of the nanowire. As a result, when the conditions of irradiation with a focused electron beam are suitably selected, a nano-barcode having a desired configuration can be easily fabricated.

As described above, the portion of a nanowire that is irradiated with the focused electron beam can be red-shifted, unlike the portion that is not irradiated with the focused electron beam. Also, the degree of red shift of the PL color is in proportion to the dose and energy of the focused electron beam. Namely, if the dose and energy of the focused electron beam are high, the PL color will be red-shifted further, and if the dose and energy of the focused electron beam are low, the PL color will not be red-shifted as much. Also, the PL intensity of the portion that is irradiated with a focused electron beam can be increased compared to that of the portion that is not irradiated with a focused electron beam. In addition, the degree of increase in the PL intensity is in proportion to the dose and energy of the focused electron beam. Namely, if the dose and energy of the focused electron beam are high, the PL intensity will be relatively high, and if the dose and energy of the focused electron beam are low, the PL intensity will be relatively low.

For example, where a π-conjugated light-emitting polymer nanowire is a P3MT nanowire, the PL color of the portion that is not irradiated with the focused electron beam is green. When the focused electron beam is irradiated onto the P3MT nanowire, the portion that is irradiated with the focused electron beam will be red-shifted, and the brightness thereof will be increased. When the dose of the focused electron beam is set within the range from $5.0 \times 10^{16}$ electrons/cm$^2$ to $9.0 \times 10^{16}$ electrons/cm$^2$, as shown in FIG. 8b, the PL color of the portion that is irradiated with the focused electron beam will be shifted to yellow. Also, when the dose of the focused electron beam is set within the range from $1.0 \times 10^{17}$ electrons/cm$^2$ to $5.0 \times 10^{17}$ electrons/cm$^2$, as shown in FIG. 8c, the PL color of the portion that is irradiated with the focused electron beam will be shifted to orange-red.

Thus, in order to fabricate a nano-barcode comprising a P3MT nanowire in which a green portion and a yellow portion are alternately formed, a focused electron beam is irradiated at a dose set within the range from $5.0 \times 10^{16}$ electrons/cm$^2$ to $9.0 \times 10^{16}$ electrons/cm$^2$ onto a desired position of a P3MT nanowire. Preferably, as shown in Example 1 above, a focused electron beam is irradiated at a dose set at about $7.5 \times 10^{16}$ electrons/cm$^2$. Meanwhile, in order to fabricate a nano-barcode comprising a P3MT nanowire in which a green portion and a red portion are alternately formed, a focused electron beam is irradiated at a dose set within the range from $1.0 \times 10^{17}$ electrons/cm$^2$ to $5.0 \times 10^{17}$ electrons/cm$^2$ onto a desired position of a P3MT nanowire. Preferably, as shown in Example 2 above, a focused electron beam is irradiated at a dose set at about $2.5 \times 10^{17}$ electrons/cm$^2$.

Figure 9:
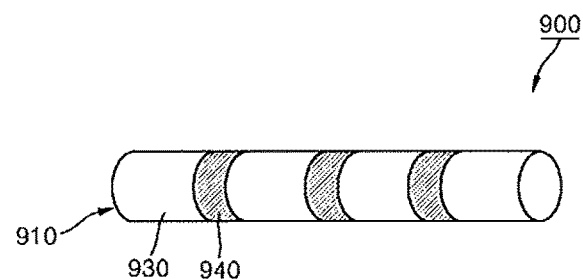
FIG. 9 schematically shows a color nano-barcode fabricated according to the method of the present invention.

The color nano-barcode fabricated by irradiating the focused electron beam is shown in FIG. 9.

FIG. 9 schematically shows a color nano-barcode fabricated according to the method of the present invention. Referring to FIG. 9, a color nano-barcode 900 fabricated according to the method of the present invention comprises a π-conjugated light-emitting polymer nanowire 910. The π-conjugated light-emitting polymer nanowire 910 comprises a region 930 showing a first PL color and a region 940 showing a second PL color. In this regard, the region 930 showing the first PL color may be a pristine portion that is not irradiated with the focused electron beam, and the region 940 showing the second PL color may be a portion that is irradiated with the focused electron beam. Thus, the color nano-barcode 900 is fabricated by irradiating the focused electron beam onto the region 940 of the π-conjugated light-emitting polymer nanowire 910 that is to show the second PL color. This color nano-barcode is named as follows:

[First PL color]-[second PL color] color nano-barcode

For example, where the PL color of the pristine portion is green and the PL color of the portion that is irradiated with the focused electron beam is yellow, the nano-barcode is named "green-yellow color nano-barcode", and where the PL color of the pristine portion is green and the PL color of the portion that is irradiated with the focused electron beam is red, the nano-barcode is named "green-red color nano-barcode". The color nano-barcode fabricated according to this method has a clear boundary between the region 930 showing the first PL color and the region 940 showing the second PL color.

Fabrication Example 1

Fabrication of Green-Yellow Color Nano-Barcode

First, a P3MT nanowire was fabricated using a nanoporous aluminum oxide template. Because the method of fabricating the P3MT nanowire using the nanoporous aluminum oxide template has been described in detail above, a detailed description of the fabrication method will be omitted here. Then, a focused electron beam having an energy of 30 keV and a dose of $7.5 \times 10^{16}$ electrons/cm$^2$ was irradiated onto the P3MT nanowire, thereby fabricating a green-yellow color nano-barcode. In this Example, the number and size of the portions irradiated with the focused electron beam were varied, thereby fabricating various green-yellow color nano-barcodes. The number of the regions showing the respective colors, the length of the yellow region, and the energy and dose of the focused electron beam used in Fabrication Example 1 are shown in Table 4 below.

TABLE 4

| | Fabrication Example 1-1 | Fabrication Example 1-2 | Fabrication Example 1-3 | Fabrication Example 1-4 |
|---|---|---|---|---|
| Number of green regions | 1 | 2 | 6 | 6 |
| Number of yellow regions | 1 | 2 | 6 | 6 |
| Length (μm) of yellow region | 10 | 5 | 1 | 0.5, 1, 2, 3, 4, 5 |
| Conditions of irradiation with focused electron beam | Energy: 30 keV, dose: $7.5 \times 10^{16}$ electrons/cm$^2$ | | | |

Figure 10:
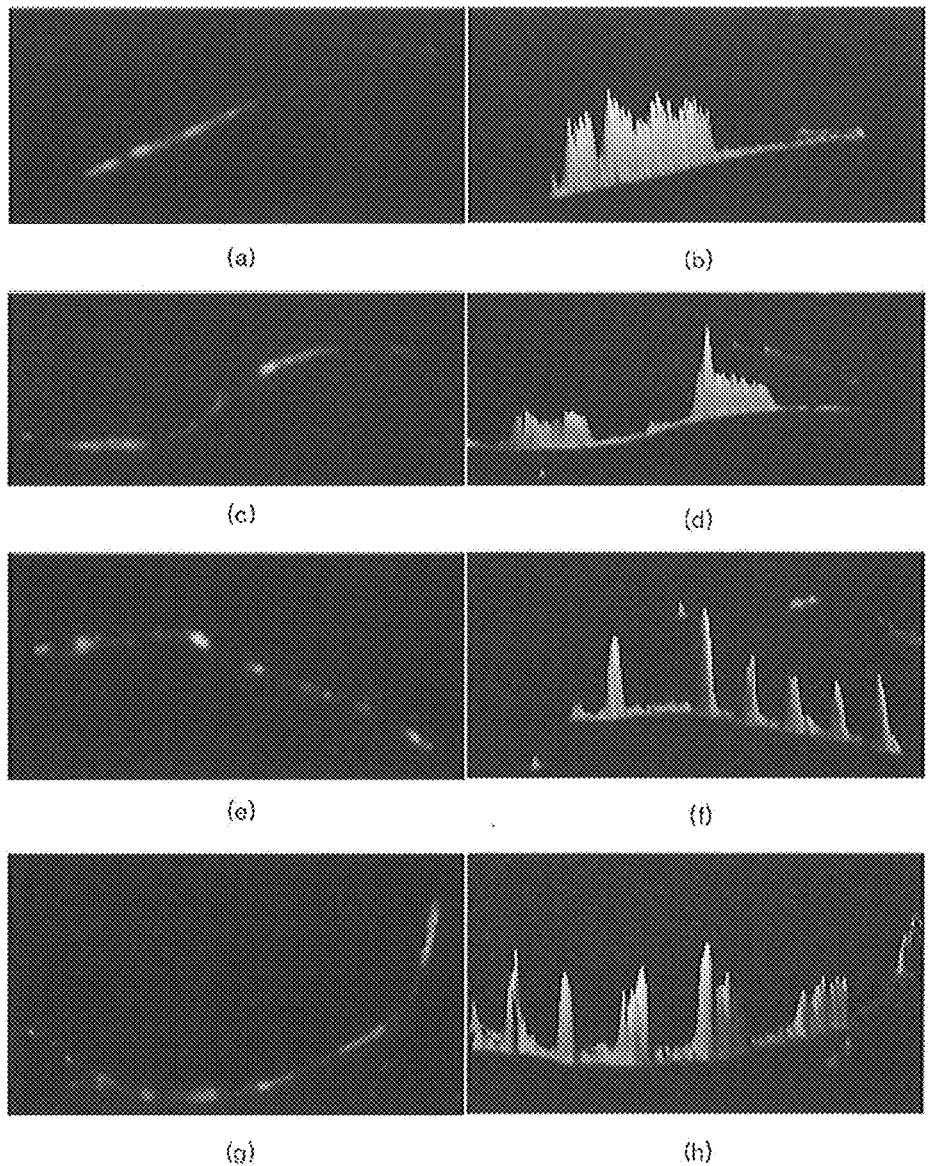

The green-yellow color nano-barcodes fabricated according to this method are shown in FIG. 10.

FIG. 10 is a set of figures showing the green-yellow color nano-barcodes fabricated by irradiating the P3MT nanowires with the focused electron beam at a dose of $7.5 \times 10^{16}$ electrons/cm$^2$. Specifically, FIGS. 10a, 10c, 10e and 10g show the color charge-coupled device images of the nano-barcodes, and FIGS. 10b, 10d, 10f and 10h show the LCM PL images of the nano-barcodes. FIGS. 10a and 10b show the green-yellow color nano-barcodes fabricated using the method of Fabrication Example 1-1; FIGS. 10c and 10d show the green-yellow color nano-barcodes fabricated using the method of Fabrication Example 1-2; FIGS. 10e and 10f show the green-yellow color nano-barcodes fabricated using the method of Fabrication Example 1-3; and FIGS. 10g and 10h show the green-yellow color nano-barcodes fabricated using the method of Fabrication Example 1-4.

As shown in FIG. 10, the PL color of the pristine portion not irradiated with the focused electron beam is green, and the PL color of the portion irradiated with the focused electron beam at a dose of $7.5 \times 10^{16}$ electrons/cm$_2$ is yellow. Also, it can be seen that the brightness of the yellow region, which was irradiated with the focused electron beam, is higher than that of the green region, which corresponds to the pristine portion. In addition, the boundary between the yellow region and the green region is clear.

FIGS. 10a and 10b show the nano-barcode fabricated by irradiating a focused electron beam at a dose of $7.5 \times 10^{16}$ electrons/cm$^2$ onto a region corresponding to about half of the P3MT nanowire having a total length of 20 μm. As shown in FIG. 10a, it can be seen that the PL color of the left side region (about 10 μm long) of the P3MT nanowire appears yellow, and that the PL color of the right side region (about 10 μm long) of the P3MT nanowire appears green. As shown in FIG. 10b, it can be seen that the region whose PL color is yellow is significantly brighter than the region whose PL color is green. As a result, as can be seen in FIGS. 10a and (10b), the green-yellow color nano-barcode fabricated according to the method of Fabrication Example 1-1 is clearly divided into two regions.

FIGS. 10c and 10d show the nano-barcode fabricated by irradiating the region (about 5 μm long) of the P3MT nanowire, having a total length of 20 μm, twice with the focused electron beam at a dose of $7.5 \times 10^{16}$ electrons/cm$^2$. In this regard, the distance between the regions irradiated with the focused electron beam is about 5 μm. Thus, as can be seen in FIG. 10c, the PL colors of the P3MT nanowire appear yellow and green alternately from the left side to the right side of the nanowire. In this regard, the length of each of the regions is about 5 μm. Also, as can be seen in FIG. 10d, the region whose PL color is yellow is significantly brighter than the region whose PL color is green. As a result, as can be seen in FIGS. 10c and (10d), the green-yellow color nano-barcode fabricated according to the method of Fabrication Example 1-2 is clearly divided into four regions.

FIGS. 10e and 10f show the nano-barcode fabricated by irradiating the region (about 1 μm long) of the P3MT nanowire six times with the focused electron beam at a dose of $7.5 \times 10^{16}$ electrons/cm$^2$. Thus, as can be seen in FIG. 10e, the PL colors of the P3MT nanowire appear yellow and green alternately from the left side to the right side of the nanowire. In this regard, the length of each of the yellow regions is about 1 μm, because a region corresponding to a length of about 1 μm was irradiated, and the length of each of the green regions corresponds to the distance between the irradiated electron beams. Also, as can be seen in FIG. 10f, the region whose PL color is yellow is significantly brighter than that the region whose PL color is green. As a result, as can be seen in FIGS. 10e and 10f, the green-yellow color nano-barcode fabricated according to the method of Fabrication Example 1-3 is clearly divided into 12 regions.

FIGS. 10g and 10h show the nano-barcode fabricated by irradiating a focused electron beam at a dose of $7.5 \times 10^{16}$ electrons/cm² onto regions (0.5 µm, 1 µm, 2 µm, 3 µm, 4 µm and 5 µm long) of the P3MT nanowire at intervals of about 0.5 µm, 1 µm, 2 µm, 3 µm, 4 µm and 5 µm. Thus, as can be seen in FIG. 10g, the PL colors of the P3MT nanowire appear yellow and green alternately from the left side to the right side of the nanowire. In this regard, the lengths of the yellow regions are about 0.5 µm, 1 µm, 2 µm, 3 µm, 4 µm and 5 µm, respectively, from the left side to the right side of the nanowire, because the focused electron beam was irradiated onto the regions corresponding to lengths of about 0.5 µm, 1 µm, 2 µm, 3 µm, 4 µm and 5 µm, respectively, from the left side to the right side of the nanowire. Also, because the focused electron beam was irradiated at intervals of 0.5 µm, 1 µm, 2 µm, 3 µm, 4 µm and 5 µm from the left side to the right side of the nanowire, the lengths of the green regions are 0.5 µm, 1 µm, 2 µm, 3 µm, 4 µm and 5 µm, respectively, from the left side to the right side of the nanowire. Also, as can be seen in FIG. 10h, the region whose PL color is yellow is significantly brighter than that of the region whose PL color is green. As a result, as shown in FIGS. 10g and 10h, the green-yellow color nano-barcode fabricated according to the method of Fabrication Example 1-4 is clearly divided into 12 regions. Also, it can be seen that, even when one of the regions has a length of 0.5 µm, the boundary between the regions is clear.

Fabrication Example 2

Fabrication of Red-Yellow Color Nano-Barcode

First, a P3MT nanowire was fabricated using a nanoporous aluminum oxide template. The fabrication of the P3MT nanowire was carried out in the same manner as Fabrication Example 1. Then, a focused electron beam having an energy of 30 keV and a dose of $2.5 \times 10^{17}$ electrons/cm² was irradiated onto the P3MT nanowire, thereby fabricating a green-red color nano-barcode. In this Example, the number and size of the portions irradiated with the focused electron beam were varied, thereby fabricating various green-red color nano-barcodes. The number of the regions showing the respective colors, the length of the red region, and the energy and dose of the focused electron beam used in Fabrication Example 2 are shown in Table 5 below.

TABLE 5

| | Fabrication Example 2-1 | Fabrication Example 2-2 | Fabrication Example 2-3 |
|---|---|---|---|
| Number of green regions | 1 | 8 | 8 |
| Number of yellow regions | 1 | 8 | 8 |
| Length (µm) of yellow region | 16 | 2 | 0.25, 0.5, 1, 2, 3, 4, 5, 6 |
| Conditions of irradiation with focused electron beam | Energy: 30 keV, dose: $2.5 \times 10^{17}$ electrons/cm² | | |

Figure 11:
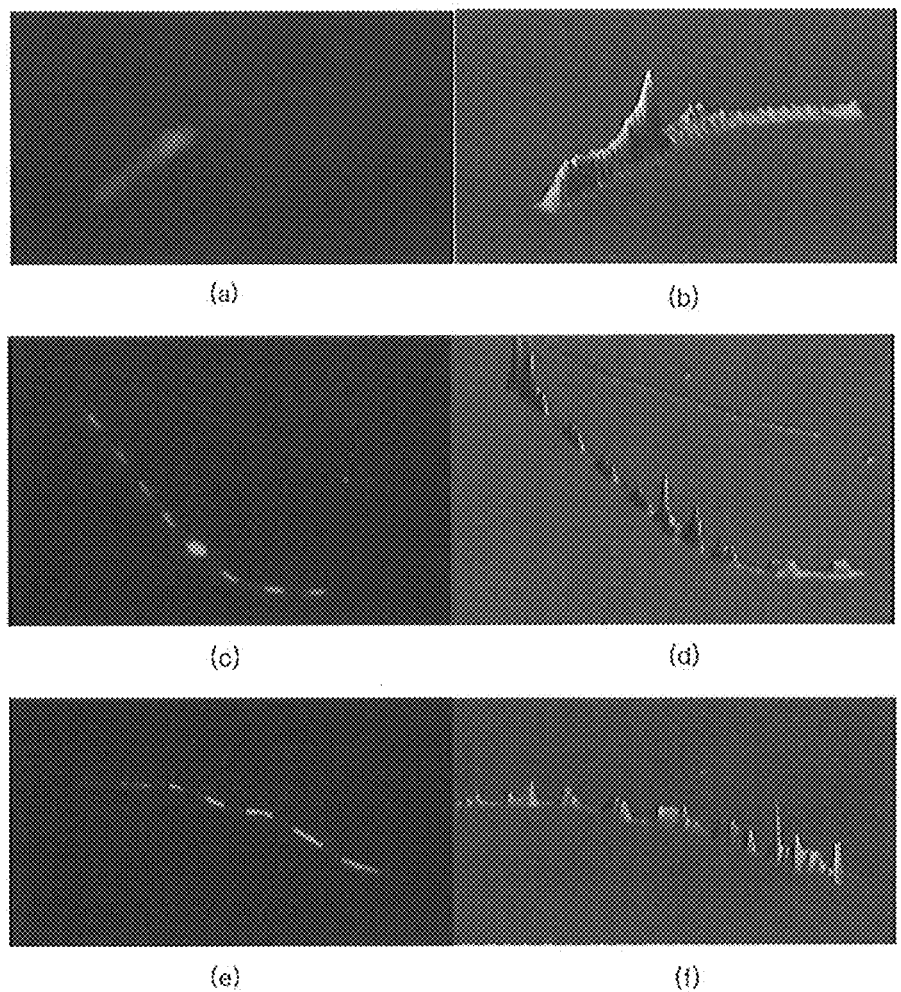

The green-red color nano-barcodes fabricated using this method are shown in FIG. 11.

FIG. 11 shows the green-red color nano-barcodes fabricated by irradiating the P3MT nanowires with the focused electron beam at a dose of $2.5 \times 10^{17}$ electrons/cm². Specifically, FIGS. 11a, 11c and 11e show the color charge-coupled device images of the nano-barcodes, and FIGS. 11b, 11d and 11f show the LCM PL images of the nano-barcodes. FIGS. 11a and 11b show the green-red color nano-barcode fabricated according to the method of Fabrication Example 2-1; FIGS. 11c and 11d show the green-red color nano-barcode fabricated according to the method of Fabrication Example 2-2; and FIGS. 11e and 11f show the green-red color nano-barcode fabricated according to the method of Fabrication Example 2-3.

As shown in FIG. 11, the PL color of the pristine portion, which was not irradiated with the focused electron beam, is green, and the PL color of the portion that was irradiated with the focused electron beam at a dose of $2.5 \times 10^{17}$ electrons/cm² was orange-red. Also, it can be seen that the brightness of the region that was irradiated with the focused electron beam is higher than that of the green region, which corresponds to the pristine portion. Because the brightness of the red region is about 50 times higher than that of the green region, the green region in FIGS. 11a, 11c and 11e is not easily recognized, but these results are highly consistent with the above-described results. Also, it can be observed that the green-red color nano-barcode also has a clear boundary between the red region and the green region.

FIGS. 11a and 11b show the nano-barcode fabricated by irradiating a region corresponding to about half of the P3MT nanowire having a total length of 32 µm with the focused electron beam at a dose of $2.5 \times 10^{17}$ electrons/cm². As can be seen in FIG. 11a, the PL color of the left side region (about 16 µm long) of the P3MT nanowire is red, and the PL color of the right side region (about 16 µm long) of the P3MT nanowire is green. However, because the region whose PL color is red is about 50 times brighter than the region whose PL color is green, the green region is not easily recognized in FIG. 11a. However, as can be seen in FIG. 11b, the region whose PL color is red is clearly distinguished from the region whose PL color is green. As a result, as can be seen in FIGS. 11a and 11b, the green-red color nano-barcode fabricated according to the method of Fabrication Example 2-1 is clearly divided into two regions.

FIGS. 11c and 11d shows the nano-barcode fabricated by irradiating the region (about 2 µm long) of the P3MT nanowire 8 times with the focused electron beam, at a dose of $2.5 \times 10_{17}$ electrons/cm², at intervals of about 2 µm. As can be seen in FIG. 11c, the PL colors of the P3MT nanowire appear red and green alternately from the left side to the right side of the nanowire. However, in this case, because the region whose PL color is red is about 50 times brighter than the region whose PL color is green, the green region is not easily recognized in FIG. 11c. However, as can be seen in FIG. 11d, the region whose PL color is red is clearly distinguished from the region whose PL region is green. In this case, because the focused electron beam was irradiated onto regions, each having a length of about 2 µm, at intervals of about 2 µm, from the left side to the right side of the nanowire, the red regions and the green regions all have a length of about 2 µm. As a result, as can be seen in FIGS. 11c and 11d, the green-red color nano-barcode fabricated according to the method of Fabrication Example 2-2 is clearly divided into 16 regions.

FIGS. 11e and 11f show the nano-barcode fabricated by irradiating the regions (about 0.25 µm, 0.5 µm, 1 µm, 2 µm, 3 µm, 4 µm, 5 µm and 6 µm long) of the P3MT nanowire with the focused electron beam at a dose of $2.5 \times 10^{17}$ electrons/cm² at intervals of about 0.25 µm, 0.5 µm, 1 µm, 2 µm, 3 µm, 4 µm, 5 µm and 6 µm, respectively. As can be seen in FIG. 11e, the PL colors of the P3MT nanowire appear red and green alternately from the left side to the right side of the nanowire. In this case, because the region whose PL color is red is about 50 times brighter than the region whose PL color is green, the green region is not easily recognized in FIG. 11e. However, as can be seen in FIG. 11f, the region whose PL color is red is clearly distinguished from the region whose PL color is green. Also, because the focused electron beam was irradiated onto the regions corresponding to lengths of about 0.25 μm, 0.5 μm, 1 μm, 2 μm, 3 μm, 4 μm, 5 μm and 6 μm from the left side to the right side of the nanowire of FIG. 11e, the lengths of the red regions correspond to about 0.25 μm, 0.5 μm, 1 μm, 2 μm, 3 μm, 4 μm, 5 μm and 6 μm, respectively, from the left side to the right side of the nanowire. In addition, because the focused electron beam was irradiated at intervals of 0.25 μm, 0.5 μm, 1 μm, 2 μm, 3 μm, 4 μm, 5 μm and 6 μm, the lengths of the green regions are about 0.25 μm, 0.5 μm, 1 μm, 2 μm, 3 μm, 4 μm, 5 μm and 6 μm, respectively, from the left side to the right side of the nanowire. As a result, as can be seen in FIGS. 11e and 11f, the green-red color nano-barcode fabricated according to the method of Fabrication Example 2-3 is clearly divided into 16 regions. Also, it can be seen that, even when one of the regions has a length of 0.25 μm, the boundary between the regions is clear.

From the above results, it can be seen that, when a single strand of a π-conjugated light-emitting polymer nanowire is irradiated with a focused electron beam, a color nano-barcode divided into a number of regions can be easily fabricated. Also, even when the length of one region is as short as about 0.25 μm, a color nano-barcode having a clear boundary between divided regions can be fabricated. As a result, a color nano-barcode having a desired configuration can be fabricated merely by changing the conditions of irradiation with a focused electron beam, and the boundary between regions in the fabricated color nano-barcode is clear.

Also, the minimum length of the region irradiated with the focused electron beam is 0.25 μm in consideration of the optical resolution of measurement systems such as a laser confocal microscope, but when the size of the focused electron beam is set at a smaller value, a nano-barcode having a minimum length of 0.25 μm or less can also be fabricated.

Hereinbefore, the color nano-barcode that exhibits a change in the PL color as the change in the photoluminescent properties of a π-conjugated polymer nanowire, which results from irradiation with a focused electron beam, has been described in detail. However, the nano-barcode according to the present invention is not limited to the above-described color nano-barcode. As described above, a nano-barcode that exhibits a change in the PL intensity as the change in the photoluminescent properties of a π-conjugated polymer nanowire can also be easily fabricated. In this case, when the conditions of irradiation with the focused electron beam are suitably selected, it is possible to fabricate a nano-barcode in which portions having a desired PL intensity are alternately formed. Also, a nano-barcode that exhibits a Raman signal as the change in the structural properties of a π-conjugated light-emitting polymer nanowire can also be easily fabricated by irradiating a focused electron beam. In this case, when the conditions of irradiation with the focused electron beam are suitably selected, it is possible to fabricate a nano-barcode in which portions having desired structural properties are alternately formed.

<Method of Modifying the Physical Properties of an Inorganic Nanostructure and a Nano-Barcode>

Figure 12:
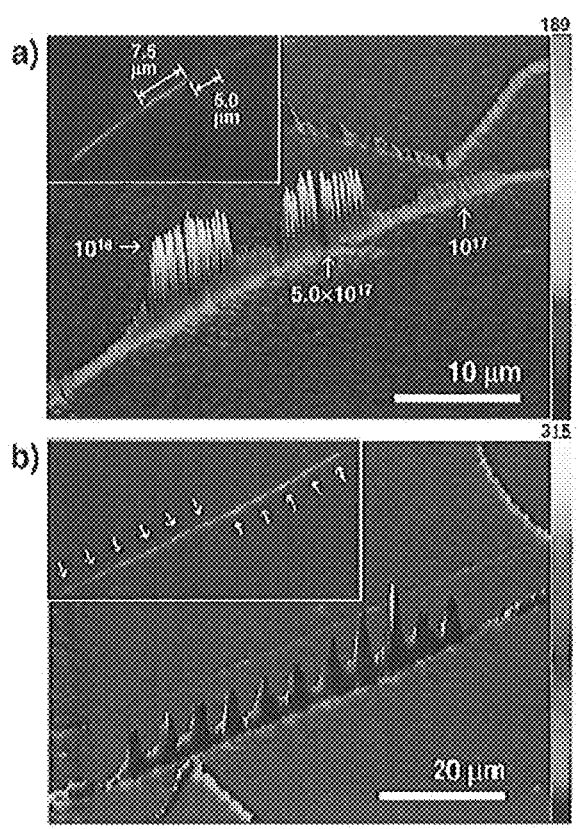

FIG. 12 shows the charge-coupled device (CCD) image and three-dimensional laser confocal microscope (LCM) photoluminescence image of a $TiO_2$ nanowire treated with a focused electron beam according to one Example of the present invention. Specifically, FIG. 12a shows the case in which focused electron beams having different densities ($1.0\times10^{17}$, $5.0\times10^{17}$ and $1.0\times10^{18}$ electrons/cm$^2$) were irradiated onto the same nanowire (the ratio of the length of the irradiated portions:the distance between the irradiated portions=7.5 μm:5.0 μm); and FIG. 12b shows the case in which the dose of a focused electron beam was set at $1.0\times10^{18}$ electrons/cm$^2$ (the ratio of the length of the irradiated portions:the distance between the irradiated portions=2.0 μm:1.5 μm). As can be seen in FIG. 12, when the focused electron beams having three densities were irradiated onto the same $TiO^2$ nanowire, the photoluminescence intensity of the nanowire increased stepwise as the dose increased (FIG. 12a). Also, a serial-junction $TiO_2$ nanowire having a total of 23 barcode components was fabricated using a focused electron beam at a dose of $1.0\times10^{18}$ electrons/cm$^2$ (FIG. 12b).

Figure 13:
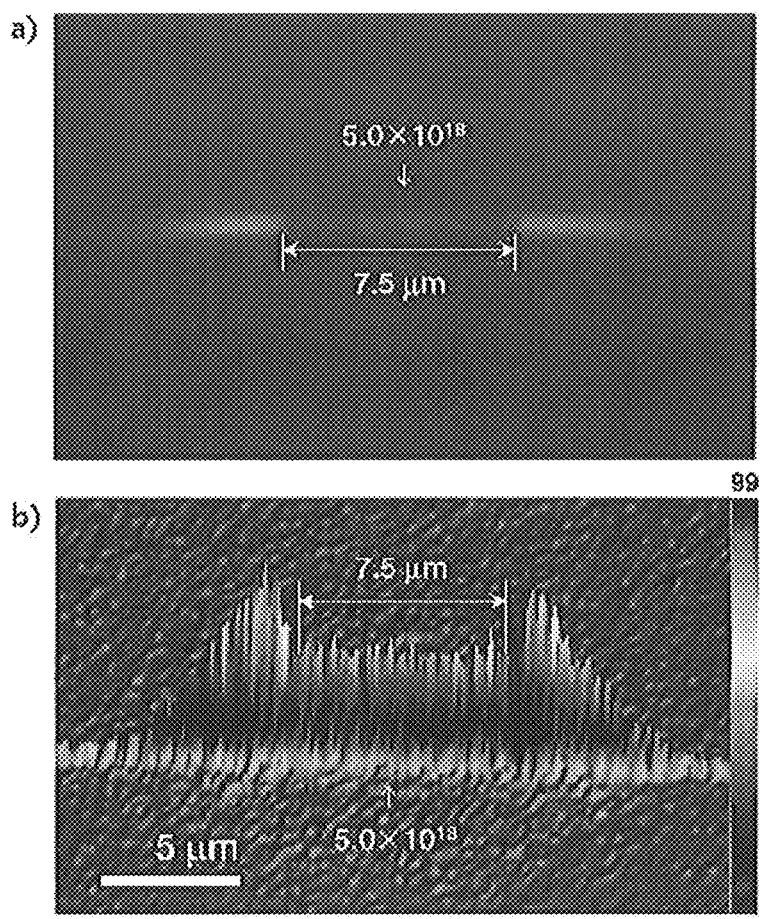
FIGS. 13(a) and 13(b) show the CCD image (FIG. 13a) and three-dimensional LCM PL image (FIG. 13b) of a TiO$_2$ nanowire treated with a focused electron beam at a dose of $5.0 \times 10^{18}$ electrons/cm$^2$ according to one embodiment of the present invention.

FIG. 13 shows the CCD image (FIG. 13a) and three-dimensional LCM PL image (FIG. 13b) of a $TiO_2$ nanowire treated with a focused electron beam at a dose of $5.0\times10^{18}$ electrons/cm$^2$ according to one Example of the present invention. In this regard, the length of the portion treated with the focused electron beam was 7.5 μm. As shown in FIG. 13, as the dose of the focused electron beam was increased, the photoluminescent properties of the treated portion greatly changed compared to when the dose of the beam was low, and the photoluminescent properties of the pristine portion also changed. This shows that the critical dose of the focused electron beam is present. This also suggests that, when a focused electron beam is irradiated at a dose higher than the critical dose, a transfer of energy from the portion irradiated with the electron beam to the pristine portion will occur, whereby the optical properties of the pristine portion are indirectly modified.

Figure 14:
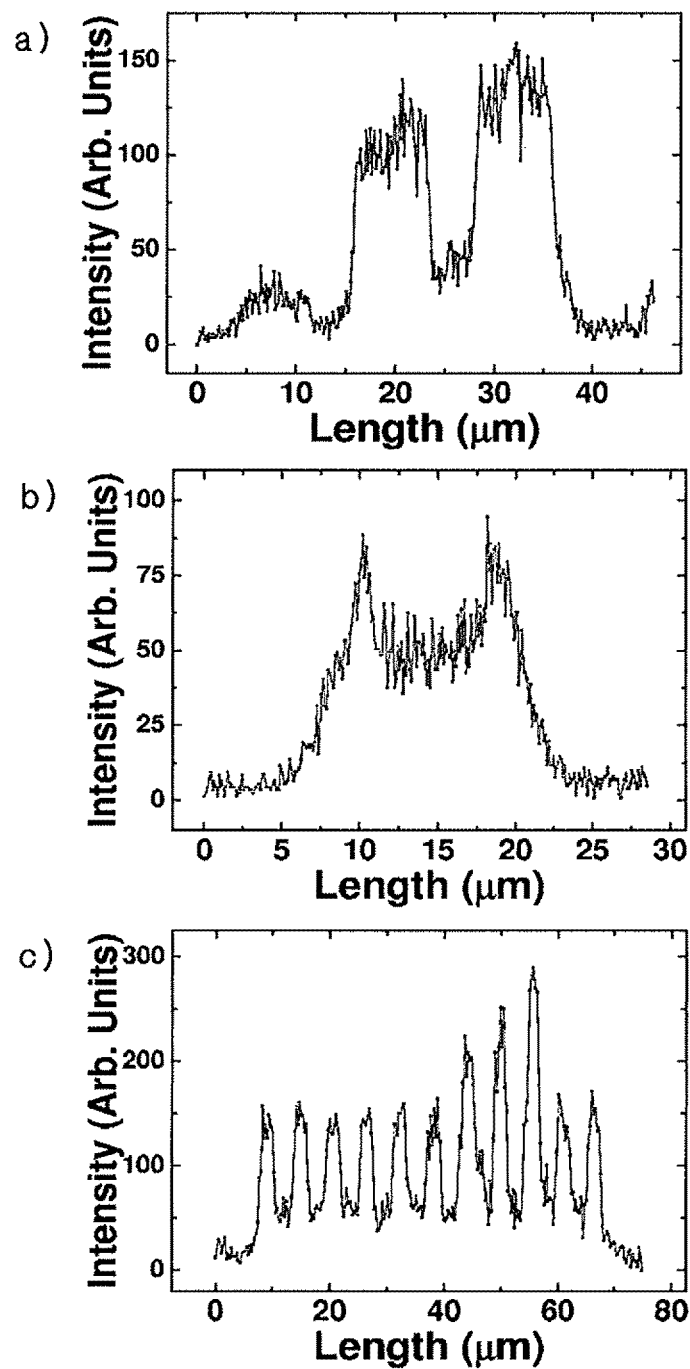

FIG. 14 is a set of figures showing line profile curves of the LCM PL intensity as a function of the length of a $TiO_2$ nanowire treated with a focused electron beam according to one Example of the present invention. Specifically, FIG. 14a shows the case in which the nanowire was treated with focused electron beams having three different doses; FIG. 14b shows the case in which the nanowire was treated with a focused electron beam at a dose of $5.0\times10^{18}$ electrons/cm$^2$; and FIG. 14c shows the case in which the nanowire was treated with a focused electron beam at a dose of $1.0\times10^{18}$ electrons/cm$^2$. As shown in FIG. 14, the line profile curves were obtained from the three-dimensional LCM PL images of FIGS. 12 and 13, and clearly indicate the optical properties of the $TiO_2$ nanowire as a function of the predesigned conditions of irradiation with the focused electron beam (the width, number and arrangement of the treated portions, dose, etc.).

Figure 15:
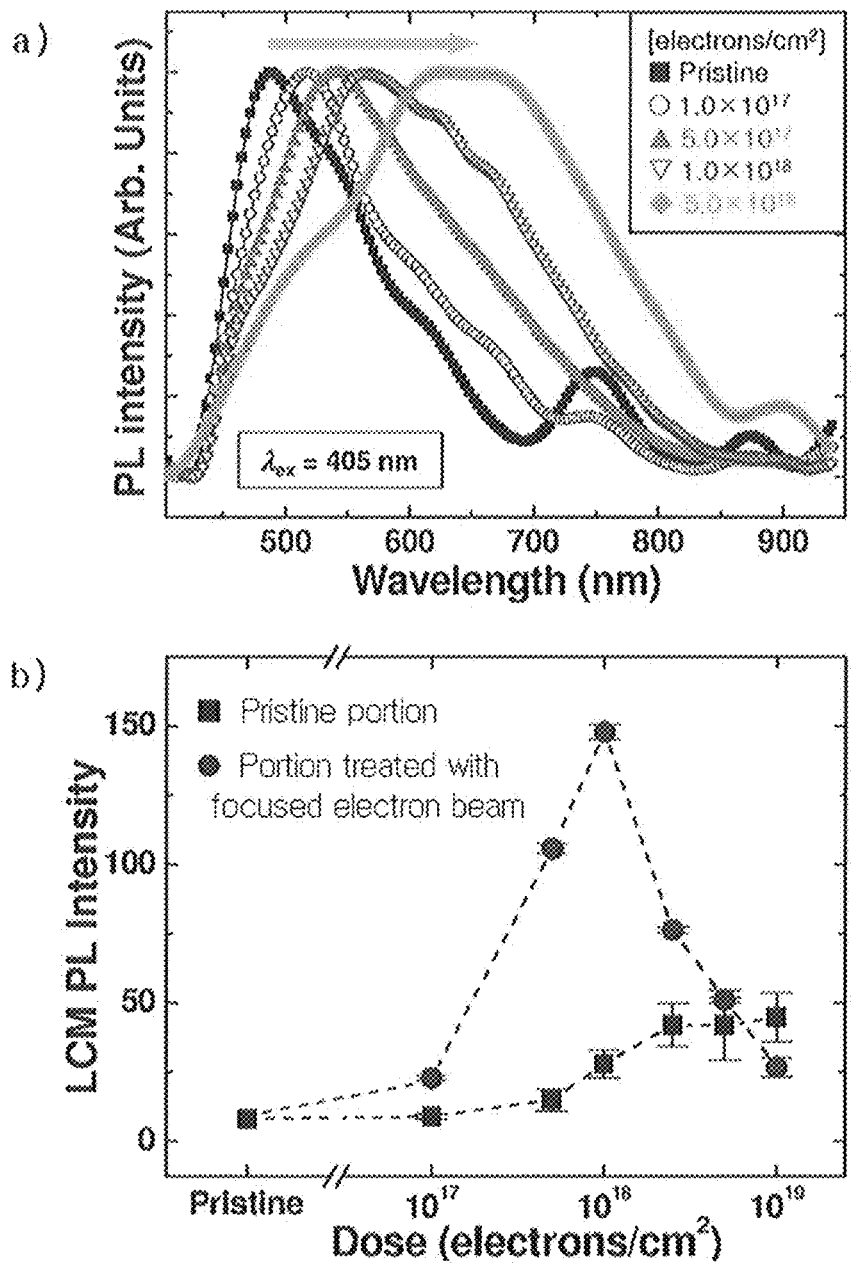
FIGS. 15(a) and 15(b) depicts a graph showing the change in the normalized LCM PL spectrum of a TiO$_2$ nanowire treated with a focused electron beam according to one embodiment of the present invention (FIG. 15a) and a graph showing the change in the LCM PL intensity of a TiO$_2$ nanowire as a function of the dose of a focused electron beam (FIG. 15b).

FIG. 15 depicts a graph showing the change in the normalized LCM PL spectrum of a $TiO_2$ nanowire treated with a focused electron beam according to one Example of the present invention (FIG. 15a) and a graph showing the change in the LCM PL intensity of a $TiO_2$ nanowire as a function of the dose of a focused electron beam (FIG. 15b).

As can be seen in FIG. 15a, the PL peak of the $TiO_2$ nanowire before treatment with the focused electron beam (pristine state) was observed at about 480 nm, and as the dose of the focused electron beam increased, the PL peak was red-shifted up to about 680 nm. This is consistent with the change in the light-emitting color that was found in the color CCD image of FIG. 12. The above results suggest that the optical property of the inorganic nanowire can also be quantitatively controlled by changing the conditions of irradiation with the focused electron beam. In this case, the optical property of the nanowire can be the light-emitting efficiency or color of the nanowire.

FIG. 15b is a graph showing the average value of the LCM PL intensities of the pristine portions and the focus electron beam-treated portions in the $TiO_2$ nanowire as a function of the dose of the focused electron beam. The average value of the LCM PL intensities was measured in the unit of photon counts, and the measurement results are summarized in Table 6 below.

TABLE 6

| Dose | 0 | 1.0 × $10^{17}$ | 5.0 × $10^{17}$ | 1.0 × $10^{18}$ | 2.5 × $10^{18}$ | 5.0 × $10^{18}$ | 1.0 × $10^{19}$ |
|---|---|---|---|---|---|---|---|
| Pristine Portions | 8 | 9 ± 1 | 15 ± 4 | 28 ± 5 | 42 ± 8 | 42 ± 13 | 45 ± 9 |
| Portions treated with focused electron beam | — | 23 ± 1 | 106 ± 2 | 148 ± 3 | 76 ± 1 | 51 ± 1 | 27 ± 4 |

Referring to Table 6 above, it is assumed that the critical dose of the focused electron beam for the $TiO_2$ nanowire will range from $1.0 \times 10^{18}$ to $5.0 \times 10^{18}$ electrons/$cm^2$. The phenomenon in which the LCM PL variation is reversed with respect to the critical dose is interpreted as the phenomenon in which the energy of the focused electron beam is transferred in the lengthwise direction of the nanowire, whereby the pristine portion is indirectly modified. The above results are highly consistent with the results observed in the color CCD and three-dimensional LCM PL images.

Figure 16:
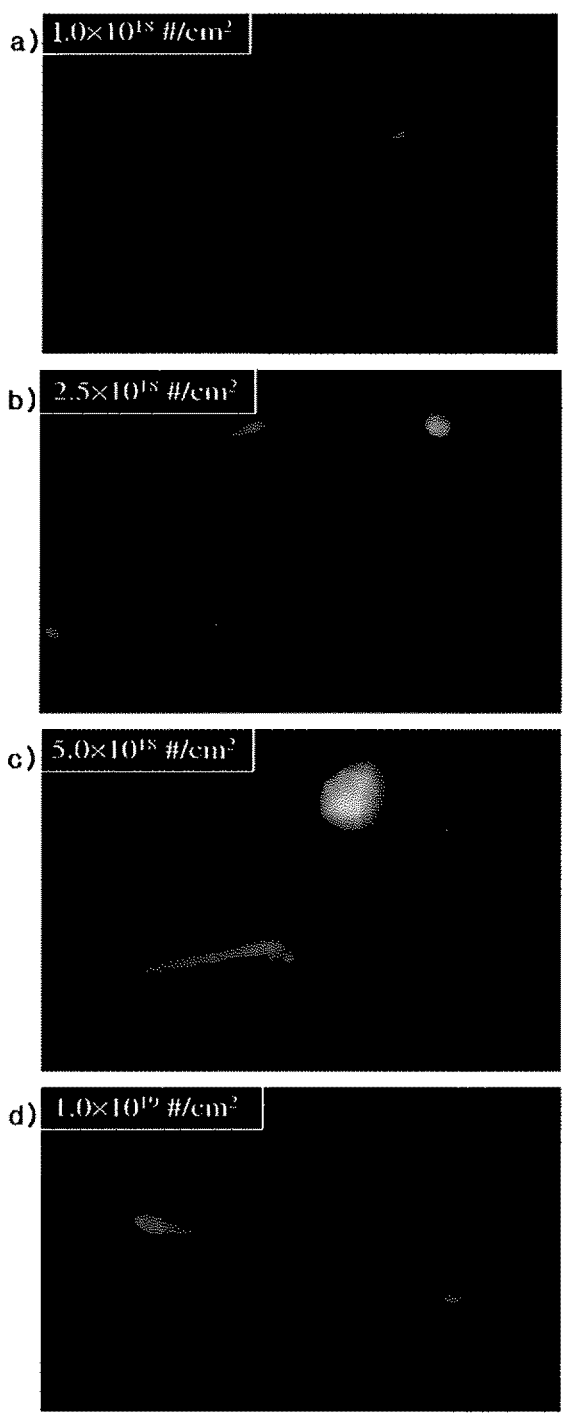
FIG. 16(a)-16(d) show color images of ZnO nanowires treated with focused electron beams according to one embodiment of the present invention.

FIG. 16 shows color images of ZnO nanowires treated with focused electron beams according to one Example of the present invention. As can be seen therein, the right half portion of the ZnO nanowire was treated with the focused electron beam, whereby the photoluminescent properties (photoluminescent color and brightness) were changed. Also, the change in the optical properties of the ZnO nanowire was correlated with the increase in the doses of the electron beams, as can be seen in the cases in which the doses of the electron beams were $1.0 \times 10^{18}$ electrons/$cm^2$ (FIG. 16a), $2.5 \times 10^{18}$ electrons/$cm^2$ (FIG. 16b), $5.0 \times 10^{18}$ electrons/$cm^2$ (FIG. 16c) and $1.0 \times 10^{18}$ electrons/$cm^2$ (FIG. 16d).

Figure 17:
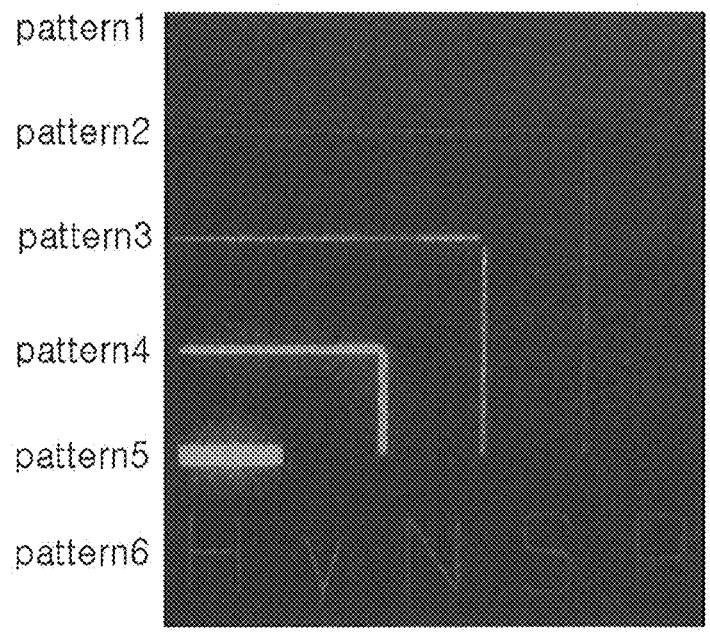
FIG. 17 shows the color CCD image of two-dimensional light-emitting nanopatterns formed on a SiO$_2$ thin film by a focused electron beam according to one embodiment of the present invention.

FIG. 17 shows the color CCD image of two-dimensional light-emitting nanopatterns formed on a $SiO_2$ thin film using a focused electron beam according to one Example of the present invention. In this regard, the thickness of the $SiO_2$ thin film was set at 1,000□, and the distance between the patterns was set at 10 μm. The physical size of each of the individual patterns is shown in FIG. 7 below. As shown therein, the desired portions of the $SiO_2$ thin film can be suitably modified by the focused electron beam, whereby two-dimensional light-emitting nanopatterns can be fabricated.

TABLE 7

|  | Pattern 1 | Pattern 2 | Pattern 3 | Pattern 4 | Pattern 5 | Pattern 6 |
|---|---|---|---|---|---|---|
| Linewidth (nm) | 100 | 200 | 500 | 1,000 | 2,000 | 200 |
| Horizontal length (μm) | 50 | 40 | 30 | 20 | 10 | N/A |
| Vertical length (μm) | 40 | 30 | 20 | 10 | N/A |  |

<Method of Modifying the Physical Properties of a Conductive Polymer Nanostructure and a Serial-Junction Nanostructure>

As a conductive polymer nanostructure, a nanowire made of polypyrrole (PPy) was used. The conductive polymer polypyrrole nanowire (NW) was fabricated through electrochemical polymerization using a nanoporous aluminum oxide template (see FIGS. 18 and 19). Alternatively, a template wetting process, a self-assembly process or an electrospinning process may be used.

Because the nanoscale modification of physical properties by irradiation with an electron beam is carried out in the single strand of the PPy nanowire, the PPy nanowires can be placed on a substrate 160 that was fabricated for bottom contact, after which the PPy nanowires can be aligned in a direction perpendicular to the Au electrode by AC field alignment. Namely, nanowires other than the single strand of the PPy nanowire can be removed directly using a micro-scale Au wire, thereby preparing a sample in which the single strand of the PPy nanowire is placed on the doped silicon substrate 160.

Changes in Structural Properties and Doping State

Figure 18:
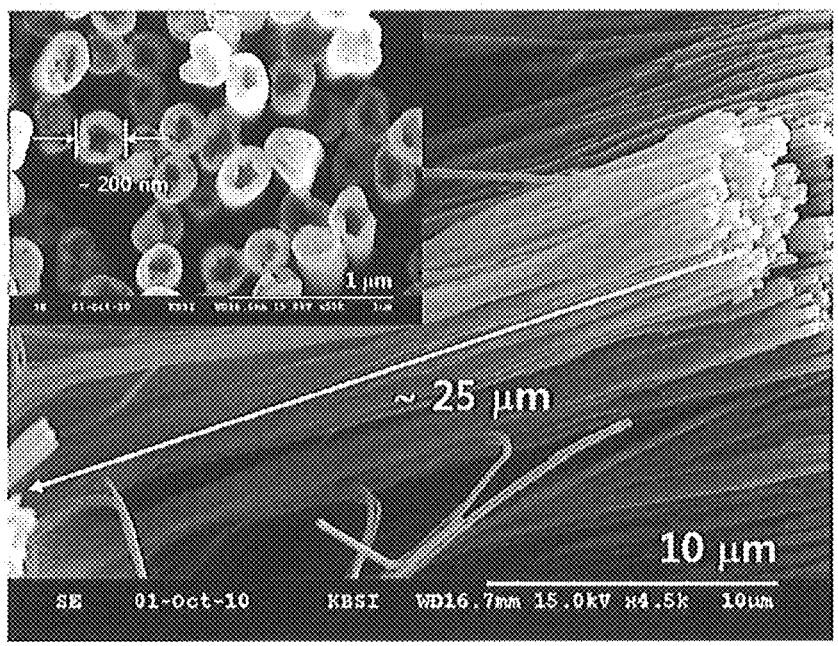
FIG. 18 shows an SEM (Scanning Electron Microscope) photograph of the side of PPy nanowires that are conductive polymer nanostructures according to one embodiment of the present invention.
Figure 19:
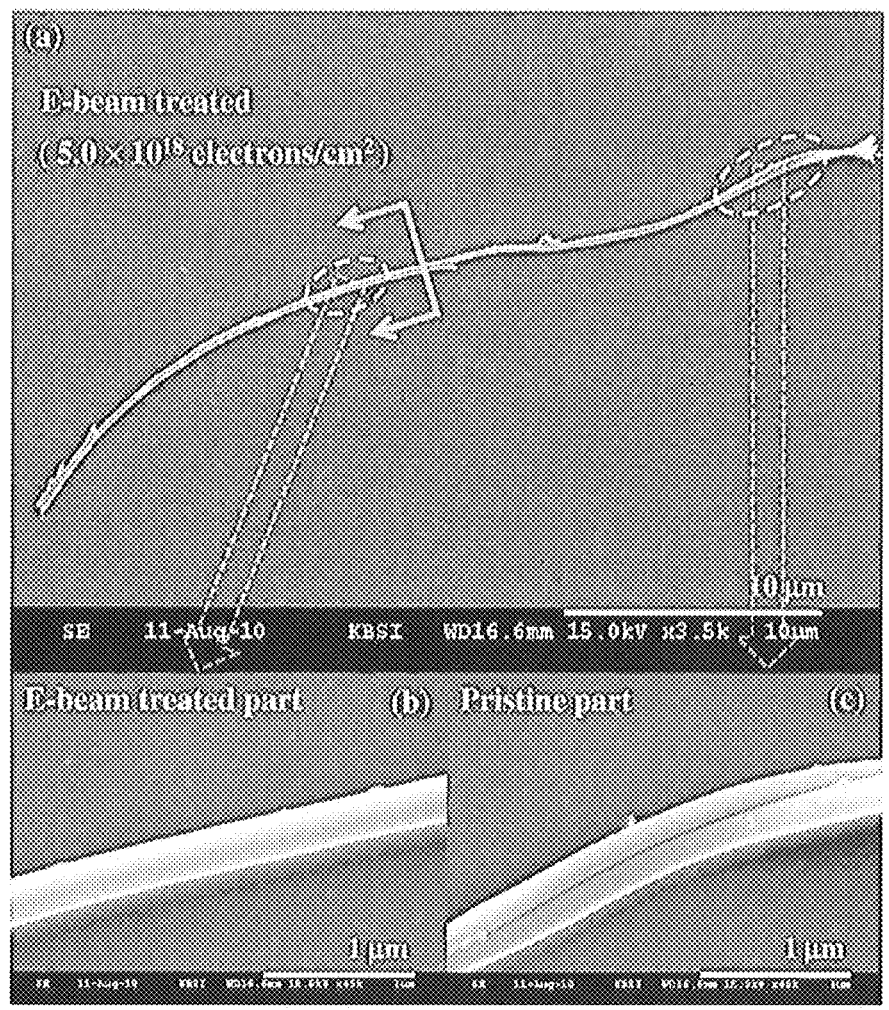
FIG. 19(a)-19(c) show a SEM photograph (FIG. 19a) of the pristine region and the focused electron beam-irradiated region in the single strand of the PPy nanowire, the physical properties of which have been modified by an apparatus for modifying the physical properties of a conductive polymer nanostructure according to one embodiment of the present invention, an enlarged photograph (FIG. 19b) of the region irradiated with the focused electron beam, and an enlarged photograph (FIG. 19c) of the pristine region.

FIG. 18 shows a SEM (Scanning Electron Microscope) photograph of the side of PPy nanowires that are conductive polymer nanostructures according to one Example of the present invention. As can be seen in FIG. 18, the PPy nanowires have a length of about 25 μm or more and a diameter of about 200 nm. A region corresponding to half of a single strand of the PPy nanowire was irradiated with a focused electron beam (dose of the focused electron beam: $5.0 \times 10^{18}$ electrons/$cm^2$), and the irradiation results are shown in FIG. 19a. FIGS. 19b and 19c are enlarged SEM photographs of the portion irradiated with the focused electron beam and the portion not irradiated with the focused electron beam, respectively. From the results shown in FIG. 19, it can be seen that the surface state of the PPy nanowire was not greatly changed by irradiation with the focused electron beam.

Figure 20:
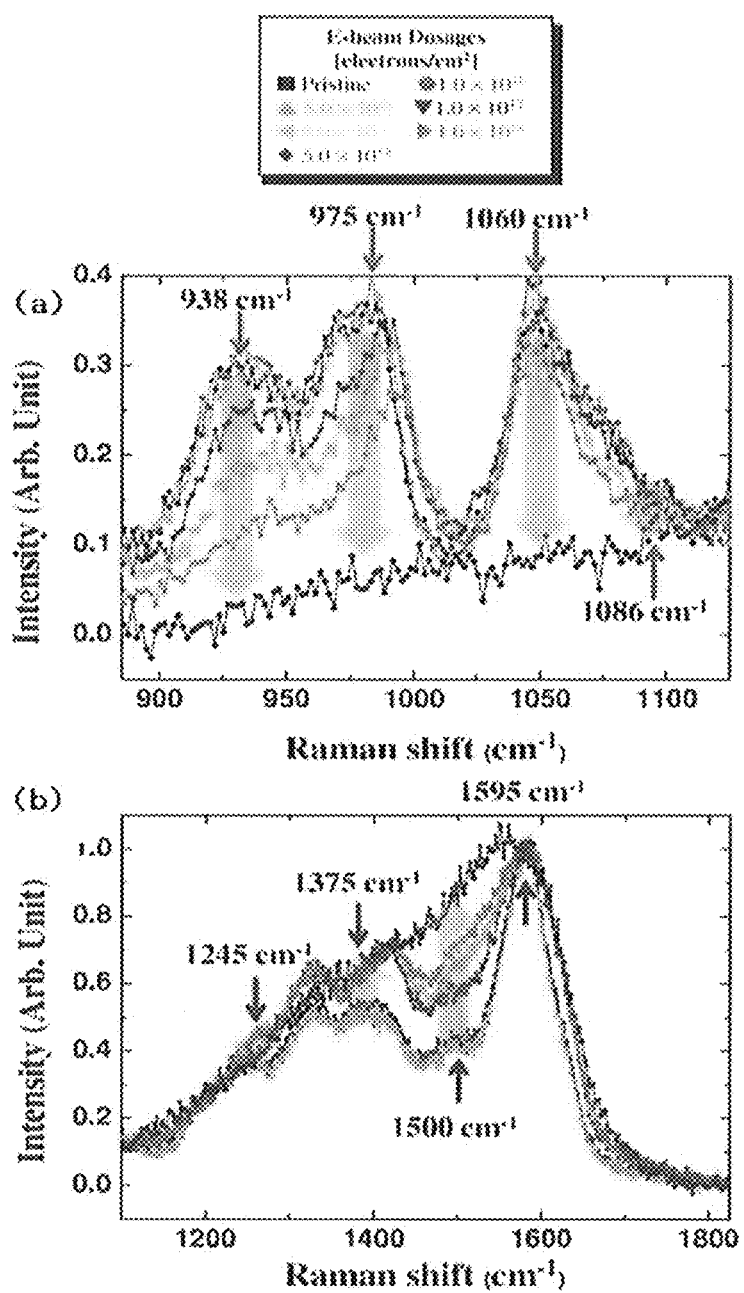
FIG. 20 shows a doping-associated Raman spectrum graph (FIG. 20a) and a structure-associated Raman spectrum graph (FIG. 20b).

FIG. 20 is a set of graphs showing the change in the Raman spectra ($\lambda_{ex}=514$ nm) as a function of the dose of a focused electron beam in the single strand of PPy nanowire, the physical properties of which have been modified using the apparatus for modifying the physical properties of a conductive polymer nanostructure according to one embodiment of the present invention. Specifically, FIG. 20 shows a doping-associated Raman spectrum graph (FIG. 20a) and a structure-associated Raman spectrum graph (FIG. 20b).

The characteristic Raman peaks of the PPy nanowire can be largely divided into two ranges. The characteristic peaks in the range of 900-1100 $cm^{-1}$, shown in FIG. 20a, are modes indicating the doping state of the single strand of the PPy nanowire. Each of the modes has the following means. Namely, the peaks that are observed at 938 $cm^{-1}$ and 975 $cm^{-1}$ are ring deformation modes associated with bipolarons and polarons, respectively, and the peaks that are observed at 1060 $cm^{-1}$ and 1086 $cm^{-1}$ are C—H plane bending modes caused by polarons and bipolarons, respectively.

Also, the characteristic peaks in the region of 1100-1800 $cm^{-1}$, shown in FIG. 20b, are modes indicating the structural state of the single strand of the PPy nanowire. The peak that is observed at 1245 $cm^{-1}$ is anti-symmetrical C—H in the plane bending mode, and the peak that is observed at 1375 $cm^{-1}$ is an anti-symmetrical C—N stretching mode. The peak that is observed at 1500 $cm^{-1}$ is a skeletal band, and the peak that is observed at 1595 $cm^{-1}$ is a symmetric C=C stretching mode (see Table 8). From the above results, it can be seen that the single strand of the doped PPy nanowire was successfully formed. The characteristic Raman modes of the PPy nanowire are summarized in Table 8 below.

TABLE 8

| Peak position ($cm^{-1}$) | Description of characteristic Raman modes |
|---|---|
| Doping induced Raman modes | |
| 938 | Ring deformation associated with bipolarons. |
| 975 | Ring deformation associated with polarons. |

TABLE 8-continued

| Peak position (cm$^{-1}$) | Description of characteristic Raman modes |
|---|---|
| 1060 | C—H in plane bending due to the polarons. |
| 1086 | C—H in plane bending due to the bipolarons. Structure induced Raman modes |
| 1245 | Anti-symmetrical C—H in the plane bending mode. |
| 1375 | Anti-symmetrical C—N stretching mode. |
| 1500 | Skeletal band. |
| 1595 | Symmetric C=C stretching mode. |

It is observed that the micro-Raman spectrum of the PPy nanowire irradiated with the focused electron beam gradually changed as the dose of the focused electron beam increased. In the case of the modes indicating the doping state of the PPy nanowire, the intensity of the characteristic peaks was decreased by irradiation with the focused electron beam, suggesting that a dedoping effect was caused by irradiation with the focused electron beam. In the case of the modes indicating the structural state of the PPy nanowire, the change in the characteristic peaks occurred as a result of irradiation with the focused electron beam, suggesting that a structural change in the PPy nanowire was caused by irradiation with the focused electron beam.

Figure 21:
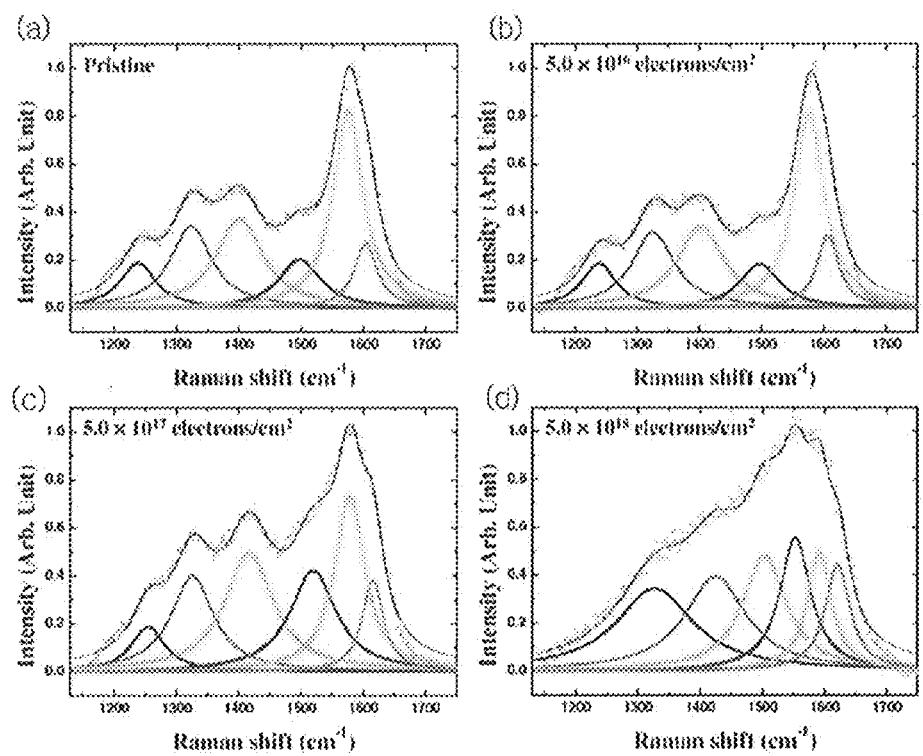
Figure 22:
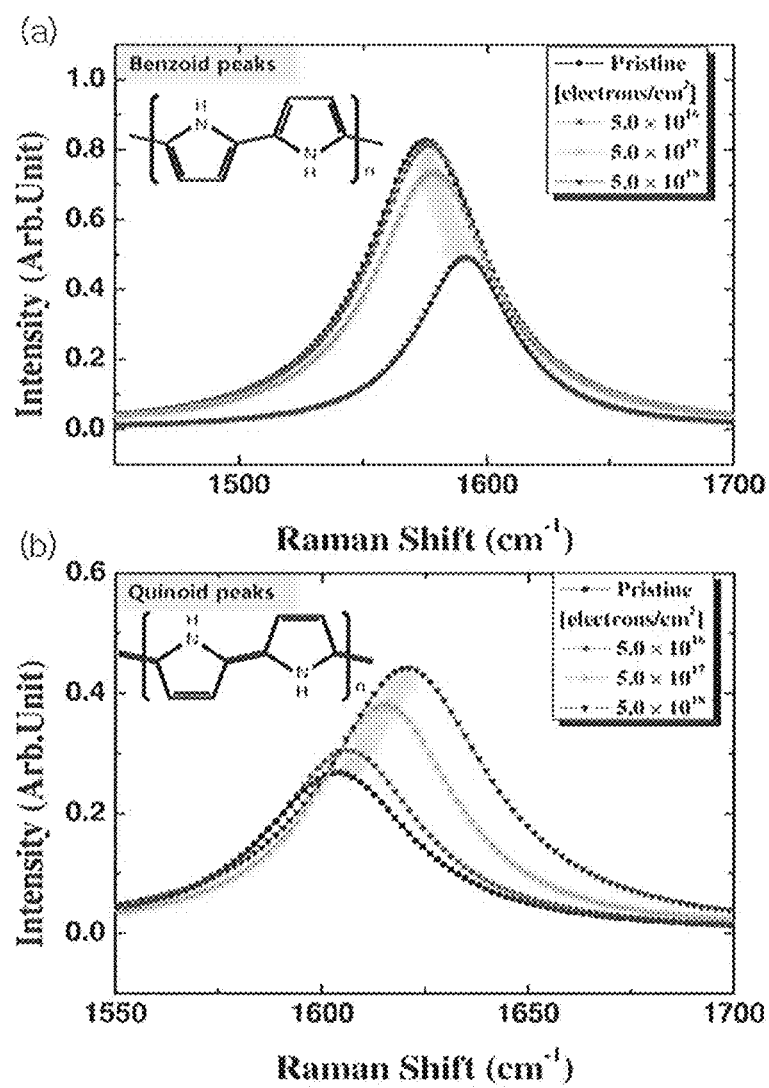
FIGS. 22(a) and 22(b) are sets of graphs showing the changes in the benzoid peak (FIG. 22a) and the quinoid peak (FIG. 22b) in the symmetric C=C stretching mode of the single strand of the PPy nanowire, the physical properties of which have been modified by the apparatus for modifying the physical properties of a conductive polymer nanostructure according to one embodiment of the present invention.

In order to specifically analyze the structural change caused by irradiation with the focused electron beam, the micro-Raman spectrum region corresponding to the range of 1050-1650 cm$^{-1}$ was decomposed into Lorentzian peaks (FIG. 21). The symmetric C=C stretching mode, that is, the peak at 1595 cm$^{-1}$ in the graph shown in FIG. 5, can be divided into a benzoid peak (FIG. 22a) and a quinoid peak (FIG. 22b). FIG. 22 shows the changes and chemical structures of the benzoid peak and the quinoid peak. In the case of the benzoid peak, as the focused electron beam was irradiated, the intensity of the peak gradually decreased and the position of the peak was shifted toward a higher wavenumber. In contrast, it was observed that, as the focused electron beam was irradiated, the intensity of the quinoid peak gradually increased and the position of the peak was shifted toward a higher wavenumber. This suggests that a structural modification of the main chain of the PPy nanowire was caused by irradiation with the focused electron beam. Also, it can be seen that, as the dose of the focused electron beam was increased, the main chain structure of the PPy nanowire changed from the benzoid structure to the quinoid structure. In addition, it can be seen that the π-conjugation length of the PPy nanowire decreased due to the structural change caused by irradiation with the focused electron beam.

Figure 23:
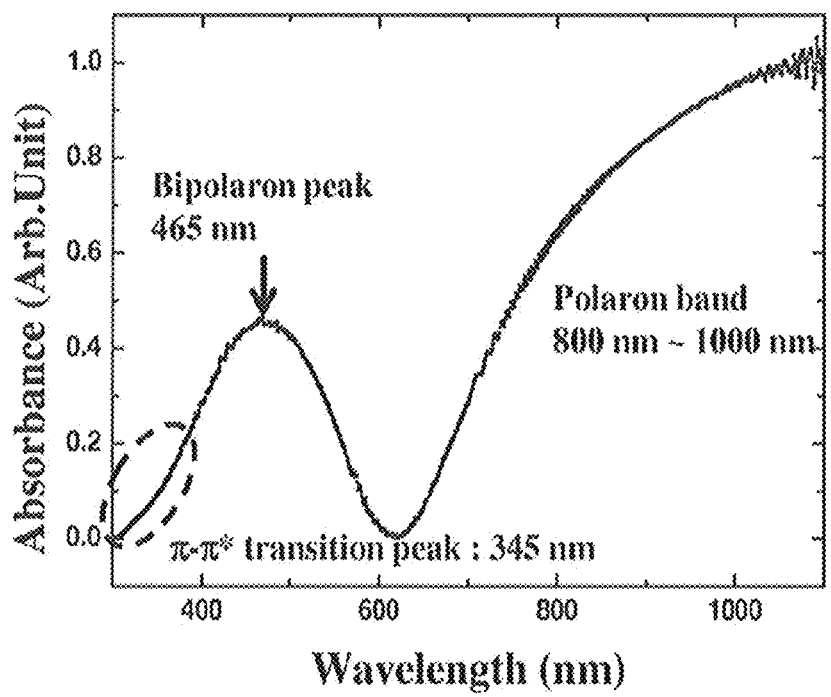
FIG. 23 shows the UV-visible light absorption spectrum of the single strand of the PPy nanowire before the physical properties of the nanowire are modified by the apparatus for modifying the physical properties of a conductive polymer nanostructure according to one embodiment of the present invention.

Based on the results of the change in the micro-Raman spectrum of the PPy nanowire, the conditions of irradiation with the focused electron beam can be controlled, thereby controlling the doping state and structural properties of the PPy nanowire on the nano scale. FIG. 23 shows the UV-visible light absorption spectrum of the single strand of the PPy nanowire before the physical properties of the nanowire are modified using the apparatus for modifying the physical properties of a conductive polymer nanostructure according to one embodiment of the present invention. As can be seen in FIG. 23, a bipolaron peak is visible at around 465 nm, and a polaron peak is visible over the range of 800-1000 nm. A slight π–π* transition peak was observed at about 345 nm. It was observed that the polaron and bipolaron peaks formed by doping were higher than the π–π* transition peak, suggesting that the pristine PPy nanowire was in a highly doped state.

Change in Electrical Properties

Figure 25:
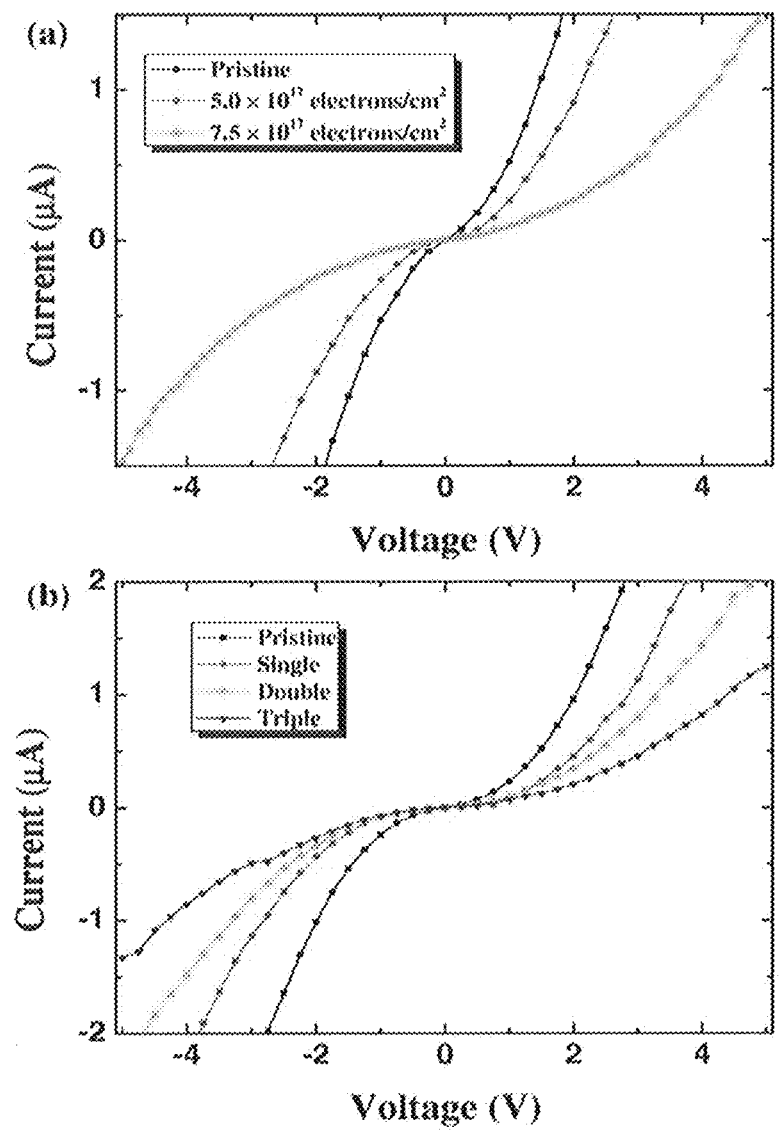

FIG. 25 is a graph showing the change in the current-voltage (I-V) characteristic curve of the single strand of the PPy nanowire, the physical properties of which have been modified using the apparatus for modifying the physical properties of a conductive polymer nanostructure according to one embodiment of the present invention. Specifically, FIG. 25 depicts a graph showing the change in the current-voltage characteristic curve as a function of the change in the dose of the focused electron beam (FIG. 25a) and a graph showing the change in the current-voltage characteristic curve as a function of the change in the number of irradiation treatments with the focused electron beam (FIG. 25b). The results shown in FIG. 25 were obtained by changing the dose of the focused electron beam and the number of treatments with the focused electron beam, and the current-voltage characteristic curve was measured at room temperature. The junction width of the portion treated with the focused electron beam was fixed at 100 nm, and the focused electron beam was irradiated at varying doses of $5.0\times10^{17}$ and $7.5\times10^{16}$ electrons/cm$^2$.

Figure 24:
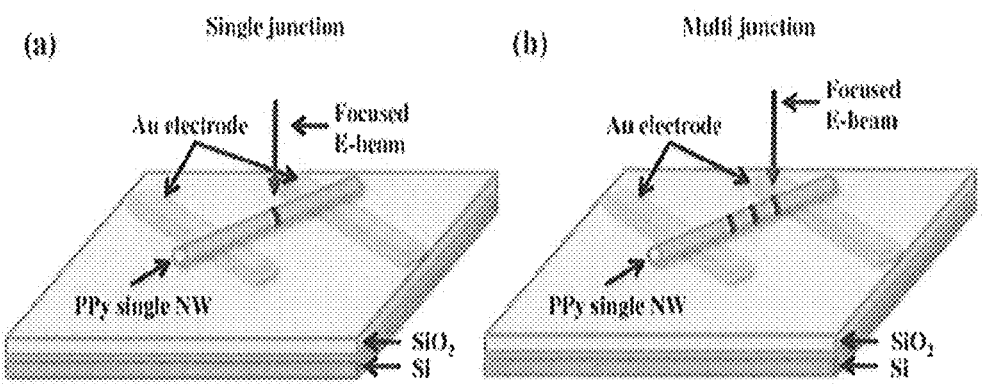
FIGS. 24(a) and 24(b) are sets of schematic views showing methods of fabricating serial-junction nanowires according to one embodiment of the present invention, and schematically shows methods of fabricating a single junction polymer PPy nanowire (FIG. 24a) and a multi-junction polymer PPy nanowire (FIG. 24b).
Figure 26:
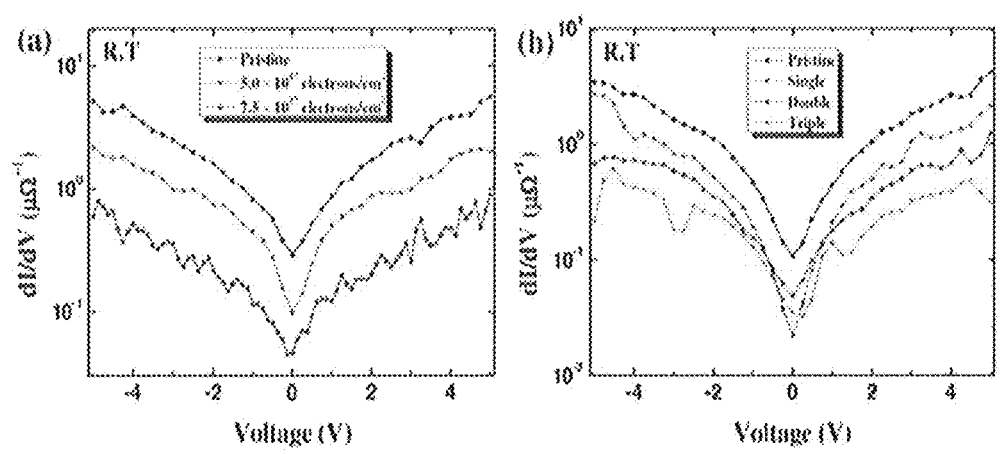
FIGS. 26(a) and 26(b) are sets of graphs showing the change in differential conductance as a function of the change in the dose of the focused electron beam (FIG. 26a) and showing the change in differential conductance as a function of the change in the number of treatments with the focused electron beam (FIG. 26b) in the case of the single strand of the PPy nanowire, the physical properties of which have been modified by the apparatus for modifying the physical properties of a conductive polymer nanostructure according to one embodiment of the present invention.

The graph shown in FIG. 25a shows the results of radiation of the focused electron beam at varying doses, and this experiment was carried out using three samples having similar current levels and current-voltage characteristic behaviors. Irradiation with the focused electron beam was carried out once in the central portion of the single strand of the PPy nanowire (single junction; see FIG. 24a). As can be seen in FIG. 25a, as the dose of the focused electron beam was increased, the current level decreased and the current-voltage characteristic curve changed in a non-linear manner. FIG. 26a is a graph showing the differential conductance calculated based on the change in the current-voltage characteristic curve as a function of the change in the dose of the focused electron beam.

The graph shown in FIG. 25b shows the change in the current level as a function of the number of treatments with the focused electron beam. In this experiment, the dose of the focused electron beam was set at $5.0\times10^{17}$ electrons/cm$^2$, and the current-voltage characteristic curve of the single strand of the PPy nanowire was measured, after which the focused electron beam was irradiated twice (double junction) and three times (triple junction) onto the same sample, followed by measurement of the current-voltage characteristic curve (see FIG. 24b). The distance between the regions irradiated with the focused electron beam was fixed at 2.5 μm. It can be seen that, like the change in the current level as a function of the dose of the focused electron beam, as the number of irradiation treatments with the focused electron beam increased, the current level decreased and the non-linear behavior became more severe. FIG. 26b is a graph showing the differential conductance calculated based on the change in the current-voltage characteristic curve as a function of the change in the number of irradiation treatments with the focused electron beam.

The above experimental results suggest that, even when a portion of the nanowire is treated with the focused electron beam, a change in the electrical properties of the entire nanowire occurs, and the nonlinear behavior of the current-voltage characteristic curve becomes severe compared to the case in which the nanowire is not doped.

Figure 27:
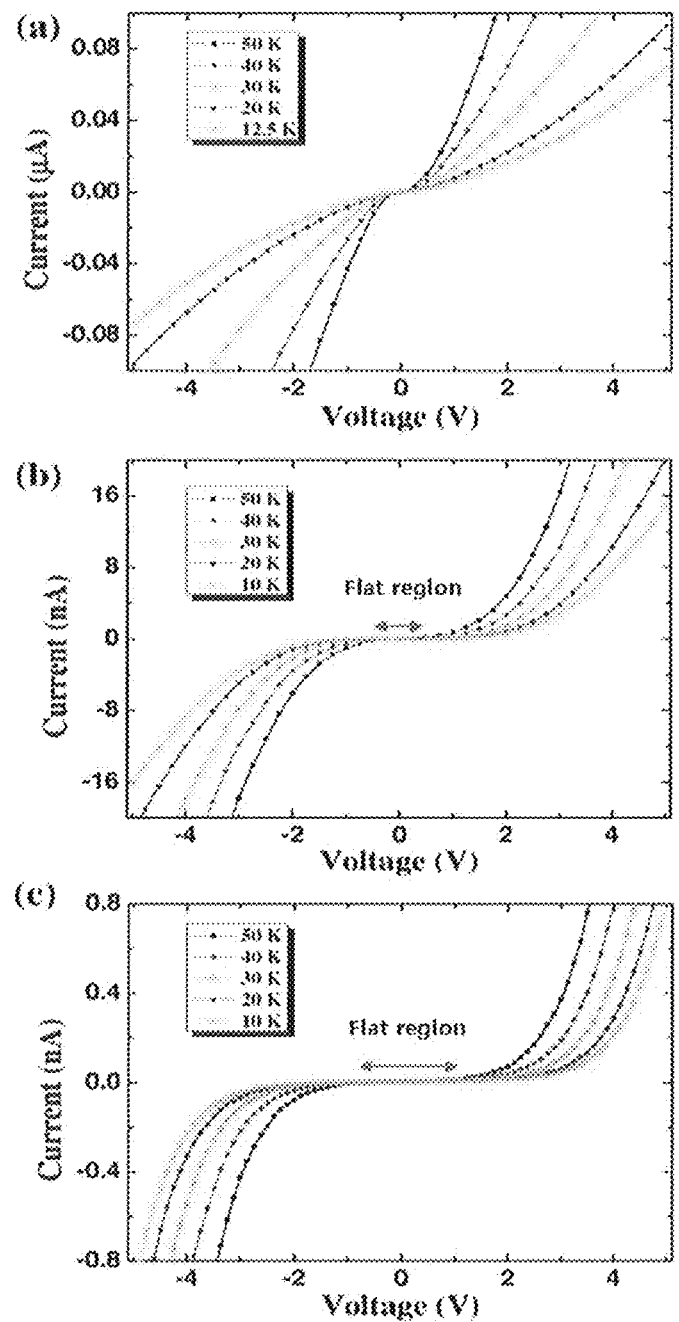
FIGS. 27(a)-27(c) are sets of graphs showing the changes in the temperature-dependent current-voltage characteristic curves of the pristine nanowire and the single strand of PPy nanowire, the physical properties of which have been modified by an apparatus for modifying the physical properties of a conductive polymer nanostructure according to one embodiment of the present invention.

FIG. 27 is a set of graphs showing the changes in the temperature-dependent current-voltage characteristic curves of the pristine nanowire and the single strand of PPy nanowire, the physical properties of which have been modified using an apparatus for modifying the physical properties of a conductive polymer nanostructure according to one embodiment of the present invention. In this experiment, the temperature was controlled within the range from room temperature to 10 K using a cryostat that uses helium gas as a coolant. Specifically, FIG. 27a is a graph showing the change in the temperature-dependent current-voltage curve of the pristine PPy that was not irradiated with the focused electron beam; and FIGS. 27b and 27c are graphs showing the change in the temperature-dependent current-voltage characteristic curve of the single strand of the PPy nanowire in which the junction width of the portion that was treated with the focused electron beam was controlled to 100 nm in the experiment that provided the data shown in FIG. 25a, and onto which the focused electron beam was irradiated at doses of $5.0 \times 10^{17}$ and $7.5 \times 10^{18}$ electrons/cm$^2$, respectively.

As can be seen from the graph shown in FIG. 27, as the temperature decreased, the current level decreased and the current-voltage characteristic curve changed in a nonlinear manner. In the case of the single strand of the PPy nanowire irradiated with the focused electron beam (FIGS. 27b and 27c), the current level showed a tendency to decrease with increasing temperature, and the nonlinear change in the current-voltage characteristic curve became more severe than in the pristine nanowire (FIG. 27a). This nonlinear change was more distinct as the dose of irradiation with the focused electron beam increased. In particular, in the current-voltage characteristic curve of the single strand of the PPy nanowire irradiated with the focused electron beam, a flat region, in which the current level in a low-voltage region approached 0, was observed.

Figure 28:
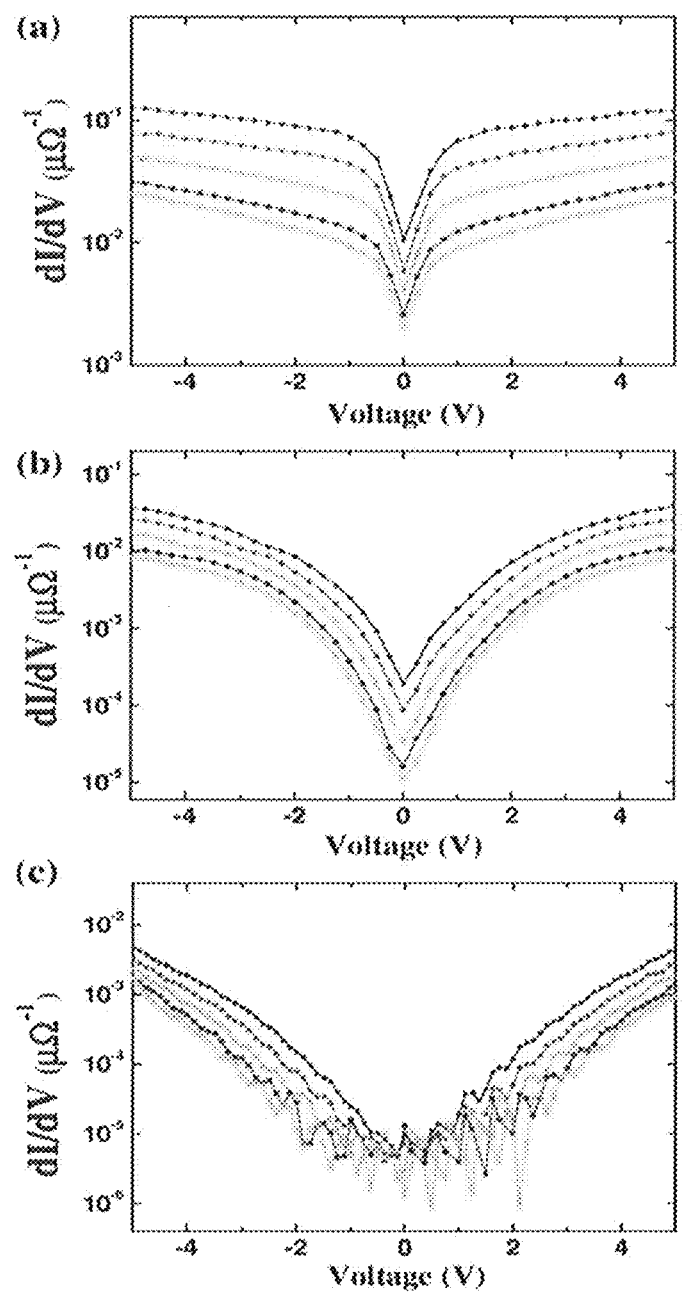
FIGS. 28(a)-28(c) depicts a graph showing the conductance gap of the pristine nanowire (FIG. 28a), a graph showing the conductance gap of the single strand of the PPy nanowire treated with a focused electron beam at a dose of $5.0 \times 10^{17}$ electrons/cm$^2$ by an apparatus for modifying the physical properties of a conductive polymer nanostructure according to one embodiment of the present invention (FIG. 28b), and a graph showing the conductance gap of the single strand of the PPy nanowire treated with a focused electron beam at a dose of $7.5 \times 10^{17}$ electrons/cm$^2$ (FIG. 28c).

FIG. 28 depicts a graph showing the conductance gap of the pristine nanowire (FIG. 28a); a graph showing the conductance gap of the single strand of the PPy nanowire treated with a focused electron beam at a dose of $5.0 \times 10^{17}$ electrons/cm$^2$ using an apparatus for modifying the physical properties of a conductive polymer nanostructure according to one embodiment of the present invention (FIG. 28b); and a graph showing the conductance gap of the single strand of the PPy nanowire treated with a focused electron beam at a dose of $7.5 \times 10^{17}$ electrons/cm$^2$ (FIG. 28c). Namely, the graphs shown in FIGS. 28a, 28b and 28c were obtained based on the graphic data shown in FIGS. 27a, 27b and 27c, respectively.

As can be seen in FIG. 28, the conductance gap was observed even around the low-voltage region, and as the temperature decreased and the dose of focused electron beam irradiated increased, the conductance gap became deeper and wider. The conductance gap is described by the difference between the differential conductance values, and appears as a rapid decrease in conductance in the low-conductance region. An increase in the width or depth in the conductance gap means an increase in the potential barrier that interferes with the conduction process. Thus, in the temperature current-voltage characteristic curve of the PPy nanowire irradiated with the focused electron beam, the region in which the current level in the low-voltage region approaches 0 widens, and this phenomenon is attributable to the phenomenon in which the conductance gap widens.

Figure 29:
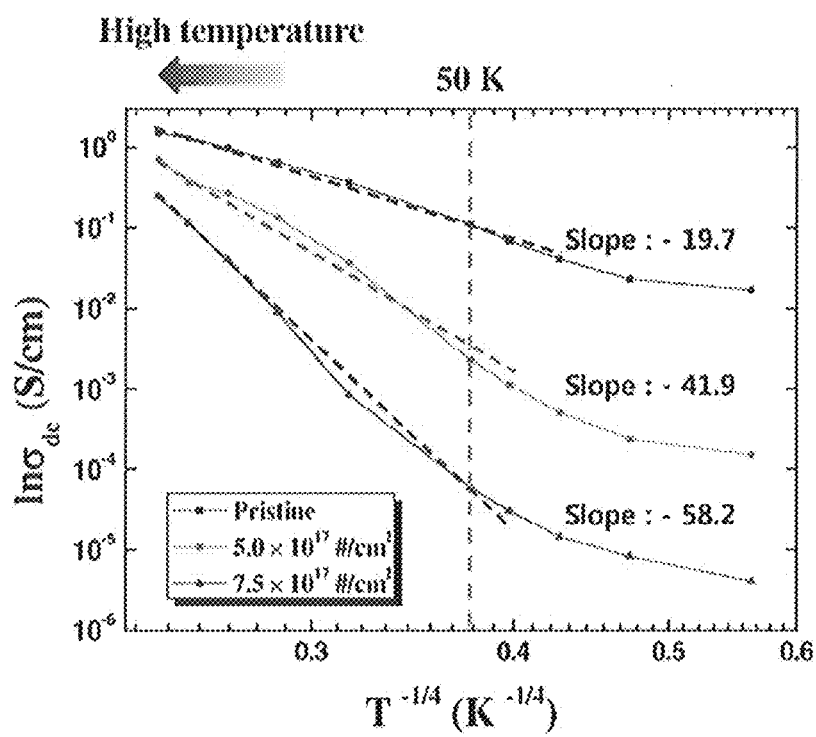
FIG. 29 is a graph showing the results of applying to a three-dimensional variable range hopping (VRH) model the temperature-dependent current-voltage characteristic curve of the single strand of the PPy nanowire, the physical properties of which have been modified by an apparatus for modifying the physical properties of a conductive polymer nanostructure according to one embodiment of the present invention.
Figure 30:
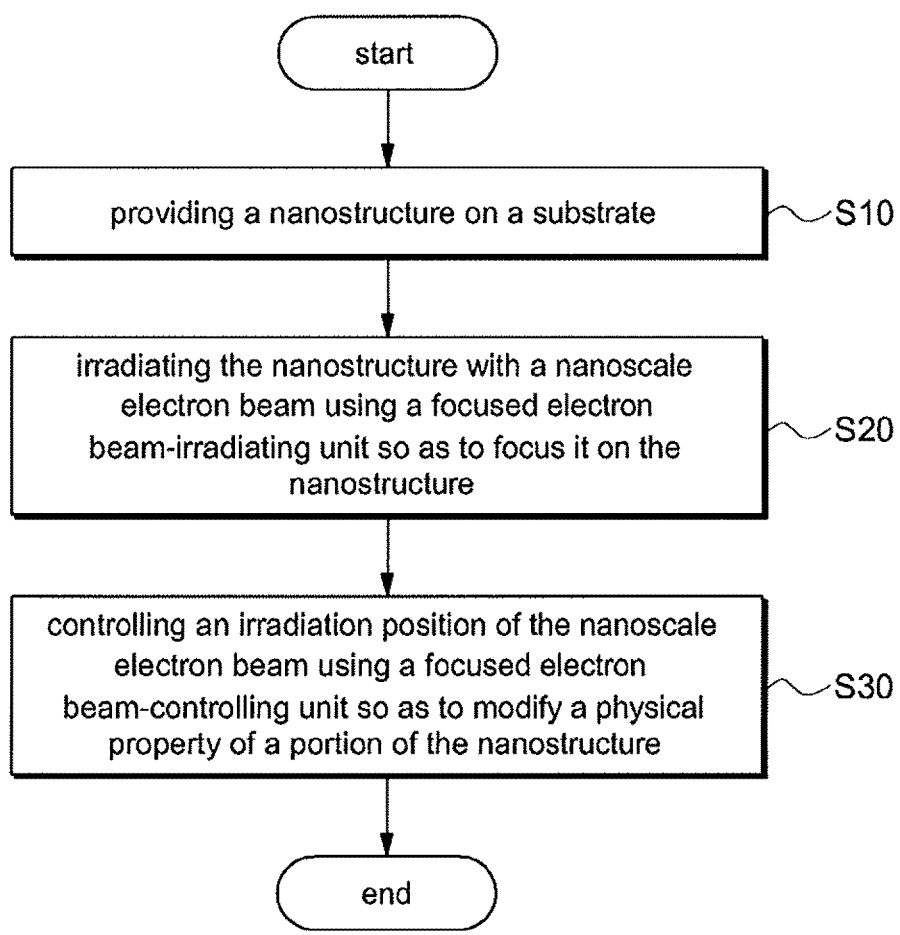
FIG. 30 is a flow chart showing a method of modifying the physical properties of a nanostructure using a focused electron beam according one embodiment of the present invention.

FIG. 29 is a graph showing the results of application to a three-dimensional variable range hopping (VRH) model the temperature-dependent current-voltage characteristic curve of the single strand of the PPy nanowire, the physical properties of which have been modified by an apparatus for modifying the physical properties of a conductive polymer nanostructure according to one embodiment of the present invention. As shown in FIG. 29, the pristine PPy nanowire conformed well to the three-dimensional VRH model at temperatures up to 20 K. The single strand of the PPy nanowire irradiated with the focused electron beam showed a tendency to deviate from the linear region of the three-dimensional VRH model with decreasing temperature, and the tendency to deviate from the linear region increased as the dose of the focused electron beam increased. Also, the slope of the three-dimensional VRH model in the linear region was measured and, as a result, it was found that the slope increased as the dose of irradiation with the focused electron beam increased. This suggests that, when irradiation with the focused electron beam does not cause a change in the state of electrons, the localization length of the PPy nanowire is shortened by irradiation with the focused electron beam. Also, a shortening in the conductive polymer PPy means that the benzoid of the PPy is changed to a quinoid structure by irradiation with the focused electron beam, which is consistent with the results of the Raman spectrum.

As described above, according to the present invention, a portion of a light-emitting polymer material or an inorganic material can be irradiated with a focused electron beam, whereby the physical properties thereof can be modified. The structural and light-emitting photoluminescent properties of a portion of a π-conjugated light-emitting polymer nanowire or an inorganic nanowire are modified, whereby a nano-barcode can be easily fabricated. A nano-barcode formed integrally of a single material, rather than an alternate arrangement of two different nanorods, can be fabricated.

According to the present invention, nano-barcode information can be recognized in various manners, either by recognizing, as a Raman signal, the change in the doped state and structural properties of a nanowire, caused by irradiation with a focused electron beam, or by recognizing the change in PL color or PL brightness caused by irradiation with a focused electron beam.

In addition, the structural properties, doped state and electrical properties of a portion of a conductive polymer nanostructure can be modified.

Although the preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus for modifying a physical property of a nanostructure using a focused electron beam, the apparatus comprising:
    the nanostructure;
    a focused electron beam- irradiating unit that serves to irradiate a nanoscale electron beam so as to be focused on the nanostructure; and
    a focused electron beam-controlling unit that serves to control an irradiation position of the nanoscale electron beam so as to modify a physical property of a portion of the nanostructure,
    wherein the nanostructure is a nanowire, a nanorod, or nanotube, and the focused electron beam-controlling unit serves to control the irradiation position so that a portion irradiated with the electron beam and a portion not irradiated with the electron beam are formed alternately along the nanowire, a nanorod, or nanotube; or wherein the nanostructure is an inorganic nanolayer, and the focused electron beam-controlling unit serves to control the irradiation position so that the inorganic nanolayer is irradiated with the electron beam to form a two-dimensional pattern.

2. The apparatus of claim 1, wherein the nanostructure is a π-conjugated polymer nanostructure or an inorganic nanostructure.

3. The apparatus of claim 2, wherein the π-conjugated polymer nanostructure is formed of a light-emitting polymer material or a conductive polymer material.

4. The apparatus of claim 3, wherein the n-conjugated polymer nanostructure is formed of one or more polymers selected from the group consisting of polythiophene, poly(p-phenylenevinylene), polythiophenevinylene, poly(p-phenylene), poly(p-phenylacetylene), and derivatives thereof.

5. The apparatus of claim 3, wherein the conductive polymer nanostructure is formed of polypyrrole.

6. The apparatus of claim 2, wherein the inorganic nanostructure is formed of titanium dioxide ($TiO_2$), zinc oxide (ZnO) or silicon dioxide ($SiO_2$).

7. The apparatus of claim 1, wherein the focused electron beam-irradiating unit is any one of a scanning electron microscope, a transmission electron microscope and an E-beam lithography system.

8. The apparatus of claim 1, wherein the electron beam has a diameter of 1 nm or more and is focused to a size of 1000 nm or less.

9. The apparatus of claim 1, wherein the physical property of the nanostructure that is modified is at least one selected from structural properties, photoluminescent properties, lattice defects, doped states and electrical properties.

* * * * *